(12) United States Patent
Lines

(10) Patent No.: US 6,703,670 B1
(45) Date of Patent: Mar. 9, 2004

(54) DEPLETION-MODE TRANSISTOR THAT ELIMINATES THE NEED TO SEPARATELY SET THE THRESHOLD VOLTAGE OF THE DEPLETION-MODE TRANSISTOR

(75) Inventor: Terry Lines, Crowley, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 38 days.

(21) Appl. No.: 09/824,653

(22) Filed: Apr. 3, 2001

(51) Int. Cl.$^7$ ................................................ H01L 29/76
(52) U.S. Cl. ...................... 257/392; 257/205; 438/217; 438/276; 438/289; 438/291
(58) Field of Search ................................. 438/257, 217, 438/276, 289, 291; 257/392, 205

(56) References Cited

U.S. PATENT DOCUMENTS

| | | | | | |
|---|---|---|---|---|---|
| 4,205,330 A | * | 5/1980 | Klein | ........................ | 257/392 |
| 4,329,186 A | * | 5/1982 | Kotecha et al. | ............. | 438/286 |
| 4,472,871 A | * | 9/1984 | Green et al. | ................ | 438/276 |
| 4,578,694 A | * | 3/1986 | Ariizumi et al. | ............ | 257/360 |
| 5,016,077 A | * | 5/1991 | Sato et al. | ................... | 257/408 |
| 5,210,437 A | * | 5/1993 | Sawada et al. | ............. | 257/392 |
| 5,245,207 A | * | 9/1993 | Mikoshiba et al. | ......... | 257/392 |
| 5,581,107 A | * | 12/1996 | Kawamura et al. | ......... | 257/392 |
| 6,020,227 A | * | 2/2000 | Bulucea | ...................... | 438/194 |
| 6,027,978 A | * | 2/2000 | Gardner et al. | ............. | 438/289 |
| 6,040,610 A | * | 3/2000 | Noguchi et al. | ............. | 257/392 |
| 6,198,140 B1 | * | 3/2001 | Muramoto et al. | ......... | 257/392 |
| 6,476,430 B1 | * | 11/2002 | Schmitz et al. | ............. | 257/274 |

OTHER PUBLICATIONS

Richard S. Muller and Theodore I. Kamins, "Device Electronics for Integrated Circuits" Second Edition, pp. 477–479.

* cited by examiner

Primary Examiner—Eddie Lee
Assistant Examiner—Eugene Lee
(74) Attorney, Agent, or Firm—Mark C. Pickering

(57) ABSTRACT

A semiconductor circuit with a depletion-mode transistor is formed with a method that eliminates the need for a separate mask and implant step to set the threshold voltage of the depletion-mode transistor. As a result, the method of the present invention reduces the cost and complexity associated with the fabrication of a semiconductor circuit that includes a depletion-mode transistor.

6 Claims, 20 Drawing Sheets

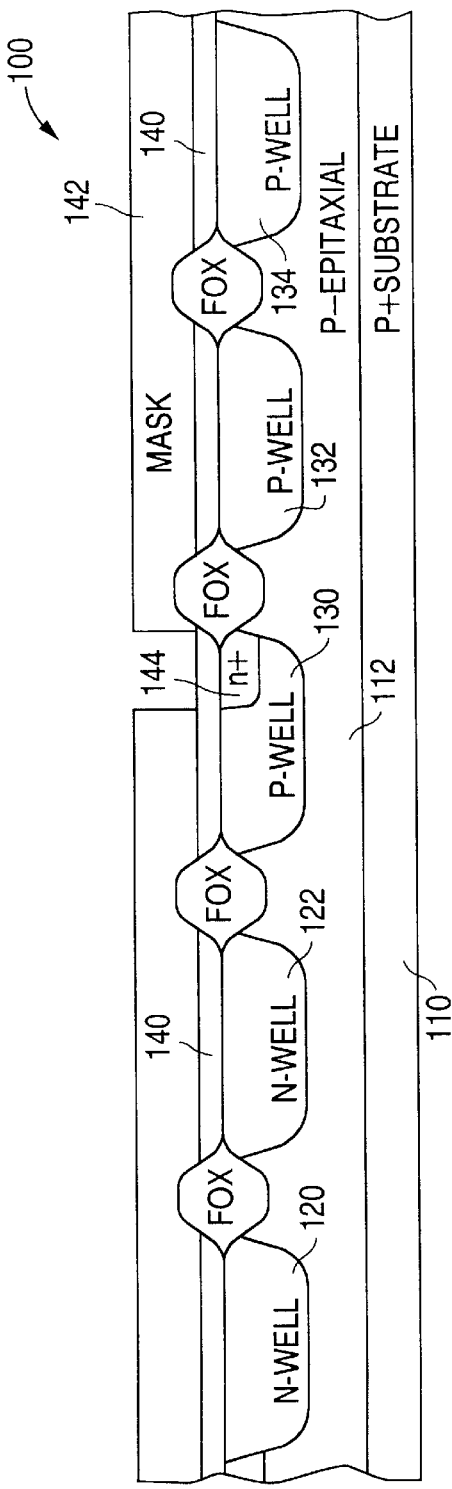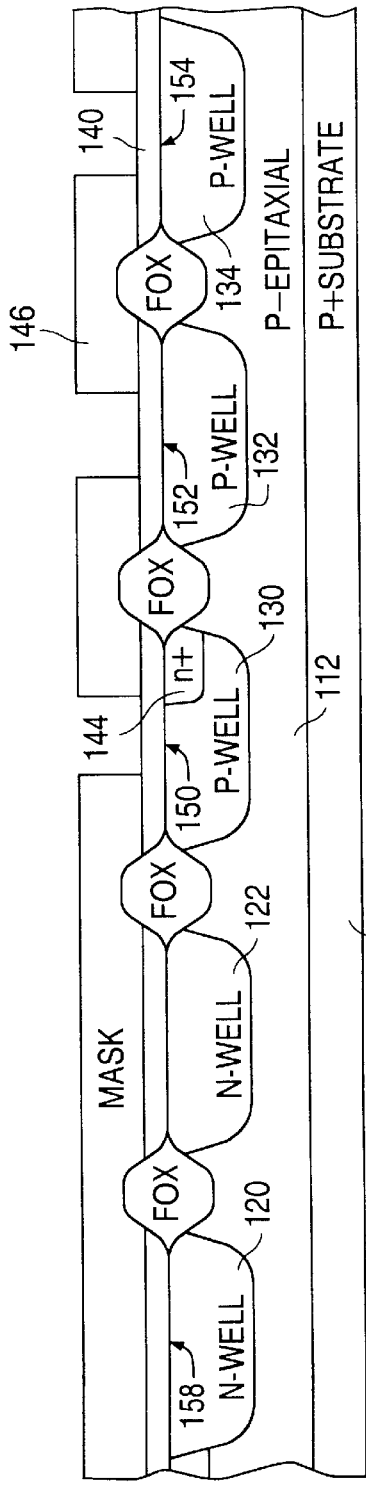
FIG. 1A
(PRIOR ART)
FIG. 1B
(PRIOR ART)

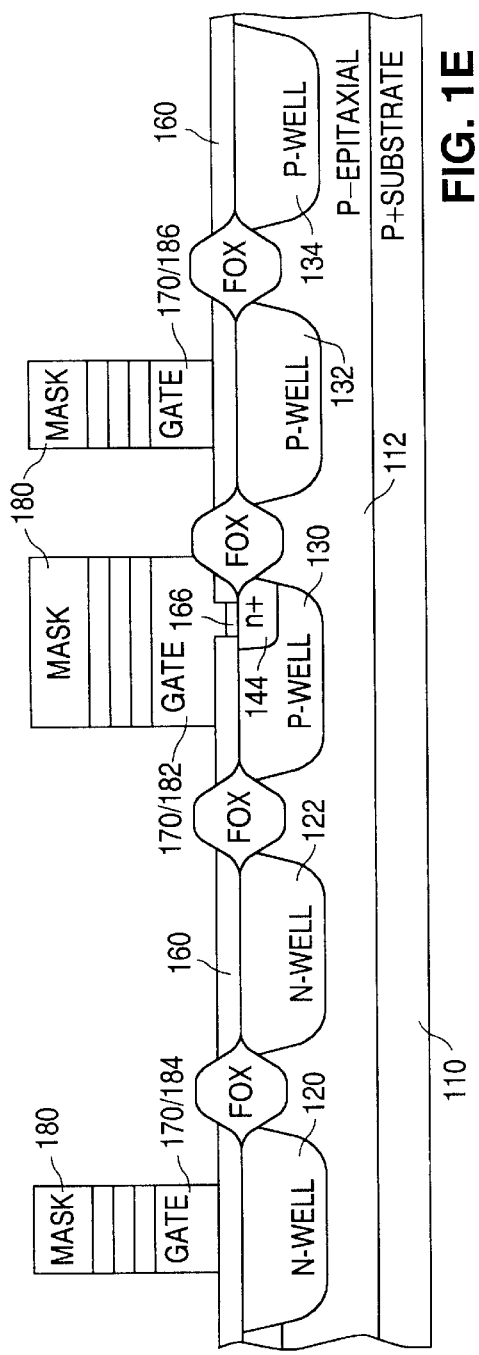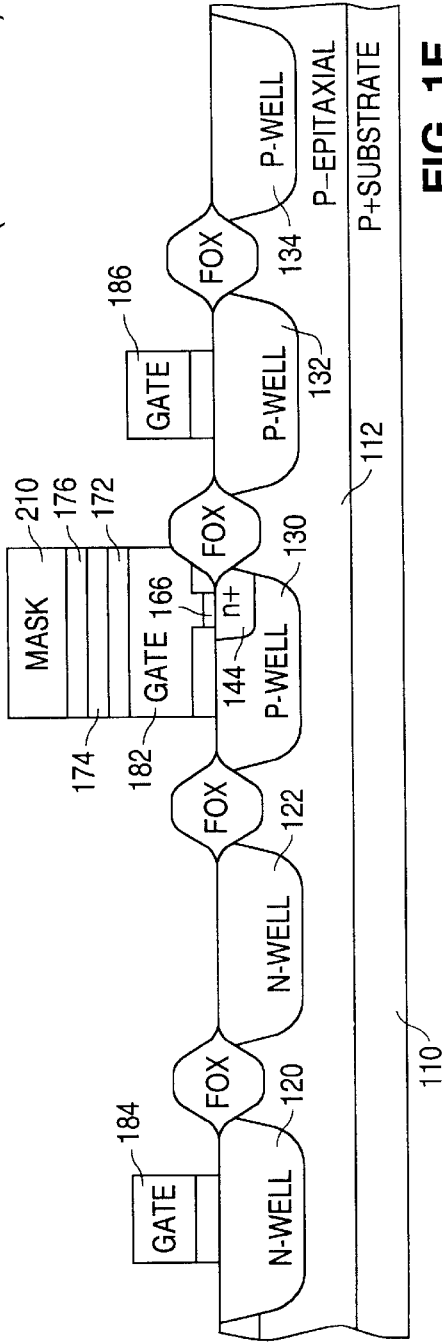

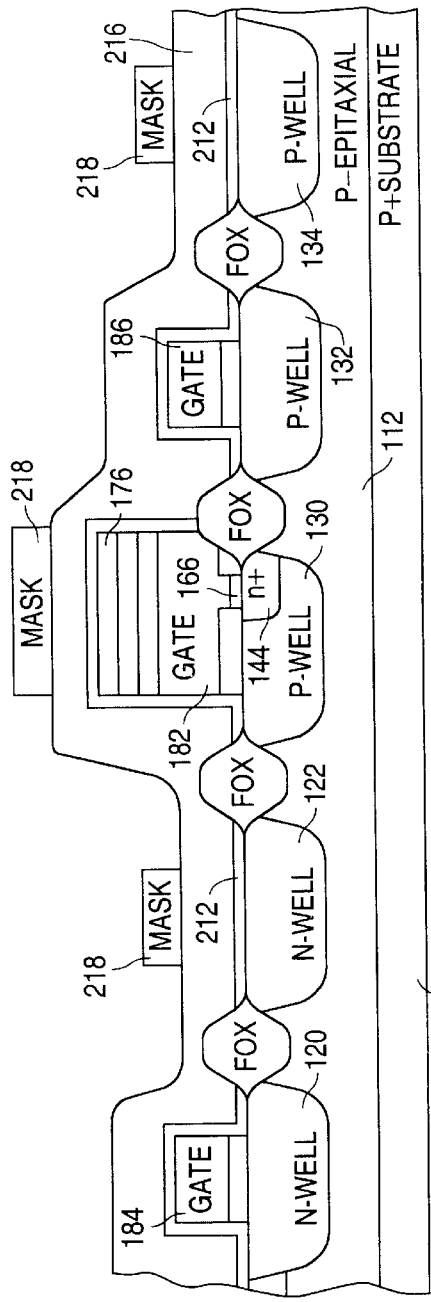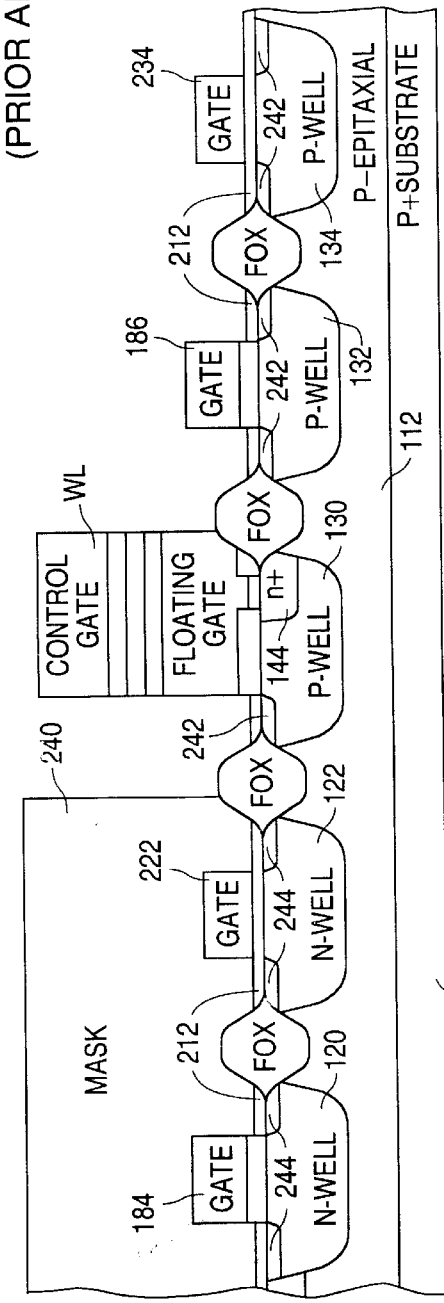

DEPLETION-MODE TRANSISTOR THAT ELIMINATES THE NEED TO SEPARATELY SET THE THRESHOLD VOLTAGE OF THE DEPLETION-MODE TRANSISTOR

BACKGROUND OF THE INVENTION

1. Field of the Invention

The present invention relates to depletion-mode transistors and, more particularly, to a method of forming a depletion-mode transistor that eliminates the need to separately set the threshold voltage of the depletion-mode transistor.

2. Description of the Related Art

MOS transistors typically fall into one of two classifications; a depletion-mode transistor or an enhancement-mode transistor. A depletion-mode transistor is a transistor that conducts (more than a leakage current) when the gate, source, and bulk are at the same potential, such as ground for an NMOS transistor and a positive voltage for a PMOS transistor. Depletion-mode transistors are commonly turned off by placing a voltage on the gate that is less than the source voltage for the NMOS transistor, and greater than the source voltage for the PMOS transistor.

An enhancement-mode transistor, on the other hand, is a transistor that is non-conductive (except for leakage currents) when the gate, source, and bulk are at the same potential. Enhancement-mode transistors are commonly turned off by placing ground on the gate of the NMOS transistor and the positive voltage on the gate of the PMOS transistor.

Depletion-mode transistors, in an always-on state, are often used in semiconductor circuits to provide a resistive element. Typically, however, a separate mask and implant step are required during the fabrication of the semiconductor circuit to set the threshold voltage of the depletion-mode transistor.

FIGS. 1A–1I show a series of cross-sectional diagrams that illustrate a prior-art method of forming a semiconductor circuit that does not include depletion-mode transistors. As shown in FIG. 1A, the prior-art method utilizes a conventionally formed wafer 100 that includes a p+ substrate 110 and a p-type epitaxial layer 112 that is formed on substrate 110.

In addition, wafer 100 also includes a number of field oxide regions FOX that are formed in epitaxial layer 112, and a number of n-wells, including first and second n-wells 120 and 122, that are formed in epitaxial layer 112. N-well 120 is utilized to support a number of hight-voltage PMOS transistors, while n-well 122 is utilized to support a number of a low-voltage, high threshold voltage PMOS transistors.

Further, wafer 100 can include a number of p-type wells, including a first p-well 130, a second p-well 132, and a third p-well 134, that are formed in epitaxial layer 112. P-well 130 is utilized to support a number of EEPROM transistors. Second and third p-wells are utilized to support a number of high-voltage NMOS transistors, and a number of low-voltage, high threshold voltage NMOS transistors.

The prior-art method begins by forming a layer of screen oxide 140 on epitaxial layer 112, followed by the formation and patterning of a first implant mask 142 on oxide layer 140. Implant mask 142 is patterned to expose a number of regions on the surface of oxide layer 140 that correspond with a number of to-be-formed n+ buried regions in p-well 130.

The number of to-be-formed n+ buried regions, in turn, corresponds with the number of EEPROM transistors that are to be formed in p-well 130. Once implant mask 142 has been patterned, the exposed regions of oxide layer 140 are implanted with a dopant, such as phosphorous or arsenic, to form a number of n+ buried regions 144. Implant mask 142 is then removed.

Next, as shown in FIG. 1B, an NMOS threshold voltage mask 146 is formed and patterned on oxide layer 140. Threshold voltage mask 146 is patterned to expose a number of regions on the surface of oxide layer 140 that correspond with a number of to-be-formed memory channel regions 150 in p-well 130, a number of high-voltage NMOS channel regions 152 in p-well 132, and a number of low-voltage, high threshold voltage NMOS channel regions 154 in p-well 134.

Once threshold mask 146 has been patterned, the exposed regions of oxide layer 140 are implanted with a dopant, such as boron, to set the threshold voltages of the to-be-formed memory transistors in p-well 130 and high-voltage NMOS transistors in p-well 132, and partially set the threshold voltage of the low-voltage, high threshold voltage NMOS transistors in p-well 134. Threshold mask 146 is then removed.

Following this, a PMOS threshold voltage mask (not shown) is formed and patterned on oxide layer 140. The PMOS threshold voltage mask is patterned to expose a number of regions on the surface of oxide layer 140 that correspond with a number of to-be-formed high voltage PMOS channel regions 158 in n-well 120. Once the PMOS threshold mask has been patterned, the exposed regions of oxide layer 140 are implanted with a dopant, such as boron, to set the threshold voltages of the to-be-formed high-voltage PMOS transistors. The PMOS threshold mask is then removed. After this, screen oxide layer 140 is removed.

Next, as shown in FIG. 1C, a layer of gate oxide 160 is formed on epitaxial layer 112, followed by the formation and patterning of a tunneling mask 162 on oxide layer 160. Tunneling mask 162 is patterned to expose a number of regions on the surface of gate oxide layer 160 that overlie and correspond with the number of n+ buried regions 144. Once tunneling mask 162 has been patterned, the exposed regions of gate oxide layer 160 are etched until gate oxide layer 160 is removed from the surfaces of p-well 130 over n+ buried regions 144. Tunneling mask 162 is then stripped.

After this, as shown in FIG. 1D, a layer of tunnel oxide 166 is grown on the exposed surfaces of p-well 130. A first layer of polysilicon (poly-1) 170 is then formed on gate oxide layer 160 and tunnel oxide layer 166, and conventionally doped. Next, a layer of oxide 172 is formed on poly-1 layer 170, followed by the formation of an overlying layer of nitride 174, and an overlying layer of oxide 176. Oxide layer 172, nitride layer 174, and oxide layer 176 form an interpoly dielectric commonly known as ONO.

Once oxide layer 176 has been formed, a poly-1 mask 180 is formed and patterned on oxide layer 176. poly-1 mask 180 is patterned to protect a number of regions on the surface of oxide layer 176 that correspond with a number of gates of the to-be-formed high-voltage transistors and a number of floating gates of the to-be-formed EEPROM transistors.

Next, as shown in FIG. 1E, the exposed regions of oxide layer 176 and the underlying layers of nitride layer 174, oxide layer 172, and poly-1 layer 170 are etched until poly-1 layer 170 is removed from the underlying layer of gate oxide 160. The etch forms the floating gates 182 of the EEPROM transistors, the gates 184 of the high-voltage PMOS transistors, and the gates 186 of the high-voltage NMOS transistors.

Following this, wafer 100 is blanket implanted with a dopant, such as boron, to set the threshold voltage of the low-voltage, high threshold voltage PMOS transistors in n-well 122. The blanket implant also partially sets (finishes setting) the threshold voltage of the low-voltage, high threshold voltage NMOS transistors in p-well 134. Boron 11, for example, can be implanted at a dose of $3.57 \times 10^{12}$ at an implant energy of 22 KeV. poly-1 mask 180 is then stripped.

Next, as shown in FIG. 1F, an ONO protect mask 210 is formed and patterned on oxide layer 176. ONO protect mask 210 is patterned to protect oxide layer 176 overlying the floating gates 182 of the to-be-formed EEPROM transistors in p-well 130. Following this, oxide layer 176, nitride layer 174, and oxide layer 172 are removed from the regions that overlie gates 184 and 186 of the to-be-formed high-voltage PMOS and NMOS transistors in n-well 120 and p-well 132, respectively. Next, gate oxide layer 160 is etched. The etch removes gate oxide 160 from the surface of n-well 122 and p-well 134. Mask 210 is then removed.

As shown in FIG. 1G, following the removal of mask 210, a thin layer of oxide 212 is formed on the exposed surfaces of wafer 100, including n-wells 120–122, p-wells 130–134, gates 184 and 186 over wells 124 and 132, and oxide layer 176 over well 130.

Following this, a second layer of polysilicon (poly-2) 216 is formed on oxide layer 212, and conventionally doped (via tube doping). Next, a word line/gate mask 218 is formed and patterned on poly-2 layer 216. Word line/gate mask 218 is patterned to define a number of strips on the surface of poly-2 layer 216 that correspond with a number of to-be-formed word lines (word lines include the control gates) over p-well 130.

Word line/gate mask 218 is also patterned to define the gates of the to-be-formed low-voltage, high threshold voltage PMOS transistors in well 122, and low-voltage, high threshold voltage NMOS transistors in well 134. Once word line/gate mask 218 has been patterned, the exposed regions of poly-2 layer 216 are etched until the exposed regions of poly-2 layer 216 are removed from the surface of oxide layer 212. Mask 218 is then removed.

As shown in FIG. 1H, the etch of poly-2 layer 216 forms a number of word lines WL. The etch also forms the gate 222 of the to-be-formed low-voltage, high threshold voltage PMOS transistors in well 122. The etch additionally forms the gate 234 of the to-be-formed low-voltage, high threshold voltage NMOS transistors in well 134.

The etch further exposes regions of oxide layer 212 that correspond with a number of to-be-formed source regions, a number of to-be-formed drain regions, and a number of to-be-formed source lines. Next, a NMOS low-density source/drain (NLDD) mask 240 is formed and patterned on wafer 100 to protect the PMOS regions of oxide layer 212. The exposed regions of oxide layer 212 are implanted with a dopant, such as phosphorous or arsenic, to form a number of n-type low-density source and drain regions 242 in wells 130–134 (only a LDD source region is formed in well 130). NLDD mask 240 is then stripped.

After this, a PMOS low-density source/drain (PLDD) mask (not shown) is formed and patterned on wafer 100 to protect the NMOS regions of oxide layer 212. The exposed regions of oxide layer 212 are implanted with a dopant, such as boron, to form a number of p-type low-density source and drain regions 244 in wells 120–122. The PLDD mask is then stripped.

Next, as shown in FIG. 1I, a layer of spacer oxide is formed on wafer 100, and anisotropically etched away to form a number of side wall spacers 246. Once side wall spacers 246 have been formed, a NMOS source/drain mask 250 is formed and patterned on wafer 100 to protect the PMOS regions. The exposed regions of oxide layer 212 are implanted with a dopant, such as phosphorous or arsenic, to form a number of n+ source and drain regions 252 in wells 130–134. The implant also forms implanted source lines in well 130. NMOS drain mask 250 is then stripped.

After this, a PMOS source/drain mask (not shown) is formed and patterned on wafer 100 to protect the NMOS regions. The exposed regions of oxide layer 212 are implanted with a dopant, such as boron, to form a number of p+ source and drain regions 254 in wells 120–122. The PMOS mask is then stripped. The process then continues with conventional steps.

One technique for adding depletion-mode transistors to the above process flow is to utilize a separate mask and implant step to set the threshold voltages of the depletion-mode transistors. Although this is a workable solution, there is a need for a method for forming depletion-mode transistors that does not require a separate mask and implant step.

SUMMARY OF THE INVENTION

The present invention provides a method for forming a semiconductor circuit with a depletion-mode transistor that eliminates the need for a separate mask and implant step to set the threshold voltage of the depletion-mode transistor. As a result, the method of the present invention reduces the cost and complexity associated with the fabrication of a semiconductor circuit that includes a depletion-mode transistor.

In the method of the present invention, the semiconductor circuit has a first channel region, a second channel region, and a third channel region. The method includes the step of implanting the first channel region and the second channel region to add a channel dopant concentration to the first channel region and a channel dopant concentration to the second channel region. The first and second channel dopant concentrations are substantially equal.

The method also includes the step of forming a layer of first oxide on the first channel region and a layer of second oxide on the second channel region, and the step of forming a layer of first polysilicon on the layer of first oxide and a layer of second polysilicon on the layer of second oxide. The method further includes the step of etching the layer of first polysilicon to form a first gate on the first region and the layer of second polysilicon to form a second gate on the second region. The first gate has a length that is approximately 0.3 to 0.8 as long as the length of the second gate.

The present invention also includes a semiconductor circuit formed by the present method. The semiconductor circuit includes first and second transistors. The first transistor has a first channel and a layer of first gate oxide formed over the first channel. The first channel has a first channel length and a first dopant concentration, while the layer of first gate oxide has a thickness. The first transistor conducts more than a leakage current when the gate, the source, and the bulk are connected to the same potential.

The second transistor has a second channel and a layer of second gate oxide that is formed over the second channel. The second channel has a second channel length and a second dopant concentration, while the layer of second gate oxide has a thickness. The second transistor is substantially non-conductive when the gate, the source, and the bulk of the second transistor are connected to the same potential. The first channel has a first channel length approximately 0.3 to 0.8 as long as the second channel length.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 1A–1I are a series of cross-sectional diagrams illustrating a prior-art method of forming a semiconductor circuit that does not include depletion-mode transistors.

FIGS. 2A–2K are a series of cross-sectional diagrams illustrating a method of forming a semiconductor circuit that includes depletion-mode transistors in accordance with the present invention.

DETAILED DESCRIPTION

FIGS. 2A–2K show a series of cross-sectional diagrams that illustrate a method of forming a semiconductor circuit that includes depletion-mode transistors in accordance with the present invention. As described in greater detail below, the method forms PMOS depletion-mode transistors by utilizing a reduced channel length and unrelated threshold voltage implants. As a result, the method of the present invention forms depletion-mode transistors without any additional process steps.

In addition to forming a depletion-mode transistor, the method also includes steps for forming a low-voltage, low threshold voltage enhancement-mode PMOS transistor. The depletion-mode transistor is formed to have a channel length that is approximately 0.3 to 0.8 the length of the channel of the enhancement-mode transistor.

The method further includes steps for forming a high-voltage, enhancement-mode NMOS transistor. The depletion-mode transistor has a channel region that is implanted each time the channel region of the low-voltage PMOS transistor is implanted, and each time the channel region of the high-voltage NMOS transistor is implanted.

The method optionally includes steps for forming a high-voltage PMOS transistor; a low-voltage, low threshold voltage NMOS transistor; a low-voltage, high threshold voltage PMOS transistor; a low-voltage, high threshold voltage NMOS transistor; and an EEPROM transistor.

Figure 1C:
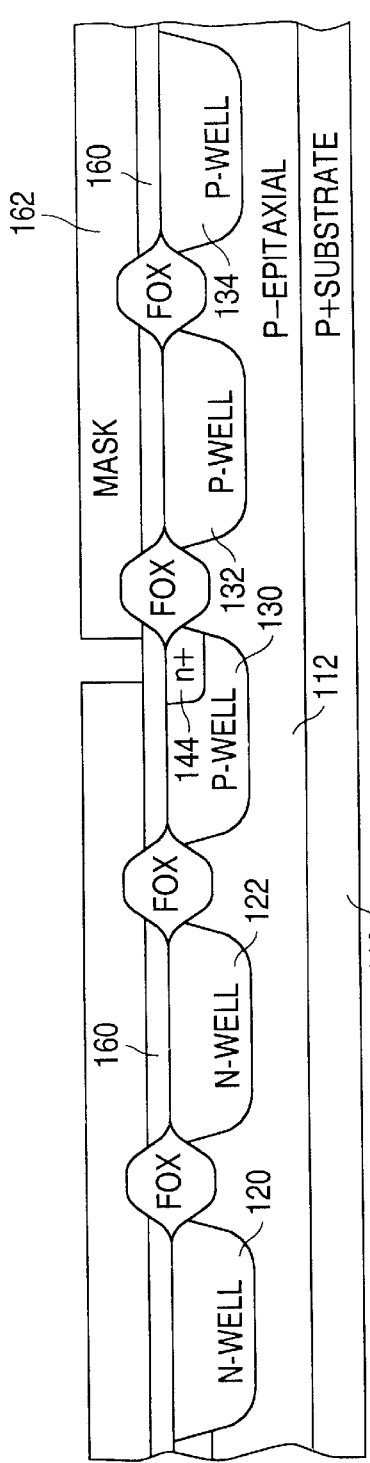
Figure 1D:
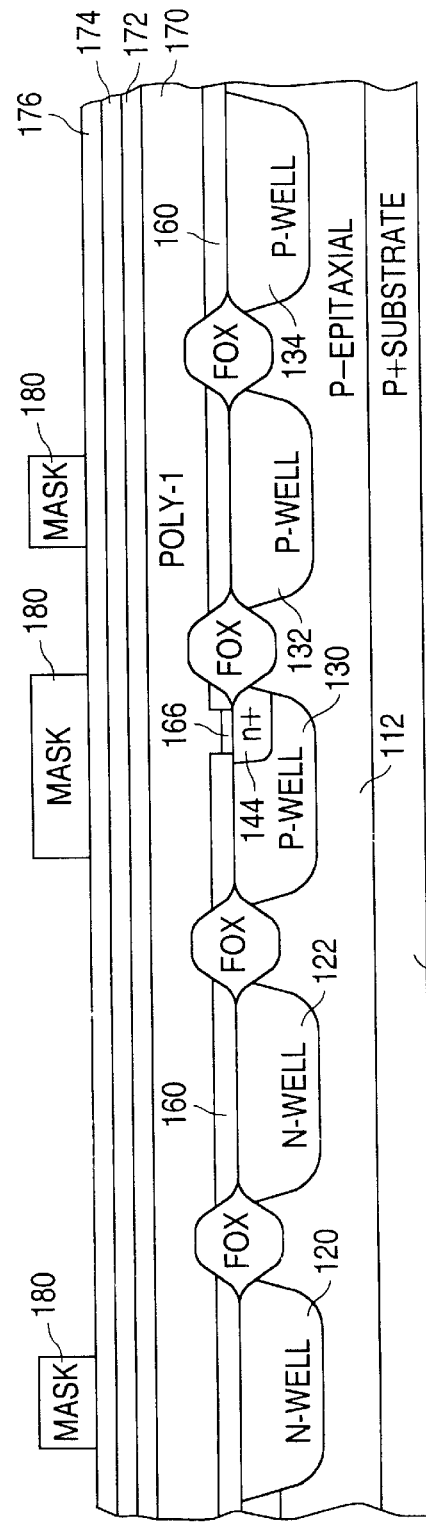
Figure 1I:
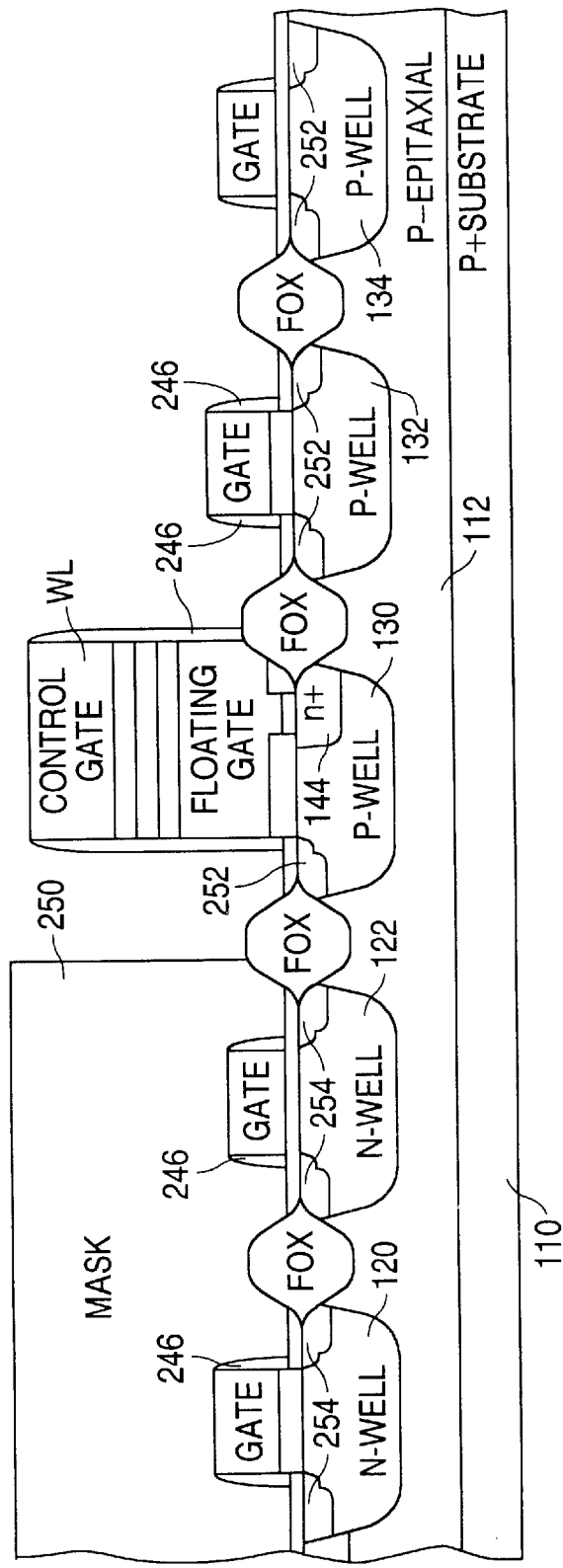
Figure 2A:
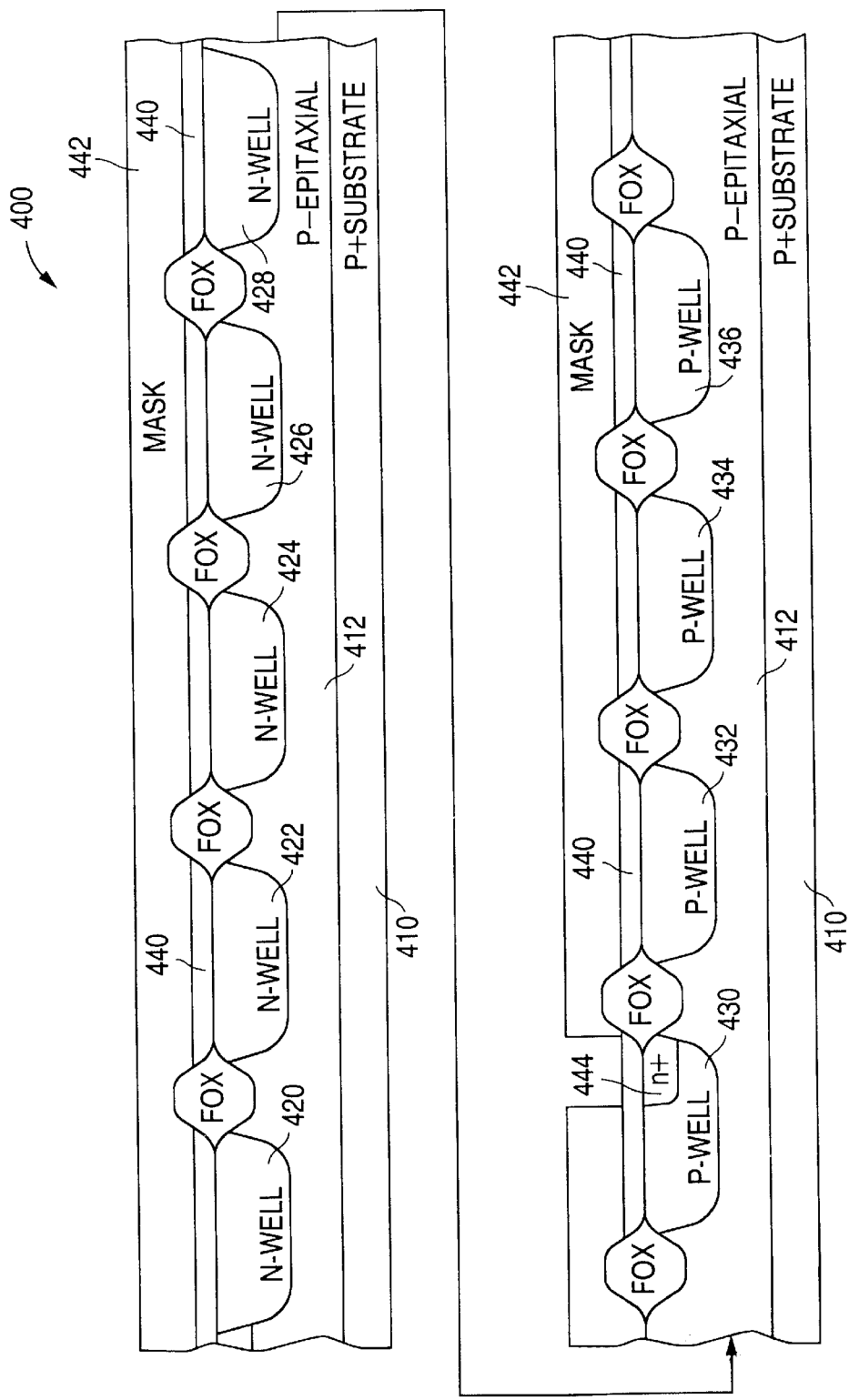

As shown in FIG. 2A, the process of the present invention utilizes a conventionally formed wafer 400 that includes a p+ substrate 410 and a p-type epitaxial layer 412 that is formed on substrate 400. Epitaxial layer 412, which is formed from a 100-orientation, single-crystal material, has a nominal thickness of 5.5 μm and a resistivity of 30 ohm-cm.

In addition, wafer 400 also includes a number of field oxide regions FOX that are formed in epitaxial layer 412, and a number of n-wells, including first, second, third, fourth, and fifth n-wells 420, 422, 424, 426, and 428, that are formed in epitaxial layer 412. Each n-well 420, 422, 424, 426, and 428 has a depth of approximately 1.4 μm and a surface dopant concentration of approximately $1 \times 10^{16}$ atoms/cm$^3$.

N-well 420 is utilized to support only a first depletion-mode transistor, while n-well 422 is utilized to support only a second depletion-mode transistor. Third, fourth, and fifth n-wells 424, 426, and 428 are utilized to support a number of high-voltage PMOS transistors; a number of a low-voltage, high threshold voltage PMOS transistors; and a number of low-voltage, low threshold voltage PMOS transistors, respectively.

Further, wafer 400 can include a number of p-type wells, including a first p-well 430, a second p-well 432, a third p-well 434, and a fourth well 436, that are formed in epitaxial layer 412. P-well 430 is utilized to support a number of EEPROM transistors. Second, third, and fourth p-wells are utilized to support a number of high-voltage NMOS transistors; a number of low-voltage, high threshold voltage NMOS transistors; and a number of low-voltage, low threshold voltage NMOS transistors, respectively.

The process of the present invention begins by forming a layer of screen oxide 440 on epitaxial layer 412, followed by the formation and patterning of a first implant mask 442 on oxide layer 440. Implant mask 442 is patterned to expose a number of regions on the surface of oxide layer 440 that correspond with a number of to-be-formed n+ buried regions in p-well 430.

The number of to-be-formed n+ buried regions, in turn, corresponds with the number of EEPROM transistors that are to be formed in p-well 430. (FIG. 2A shows only one opening in mask 442 for purposes of illustration only. The number of openings in mask 442 corresponds with the number of to-be-formed EEPROM memory cells.) Once implant mask 442 has been patterned, the exposed regions of oxide layer 440 are implanted with a dopant, such as phosphorous or arsenic, to form a number of n+ buried regions 444. (N+ regions 444 can be formed as double diffused drain regions.) Implant mask 442 is then removed.

Figure 2B:
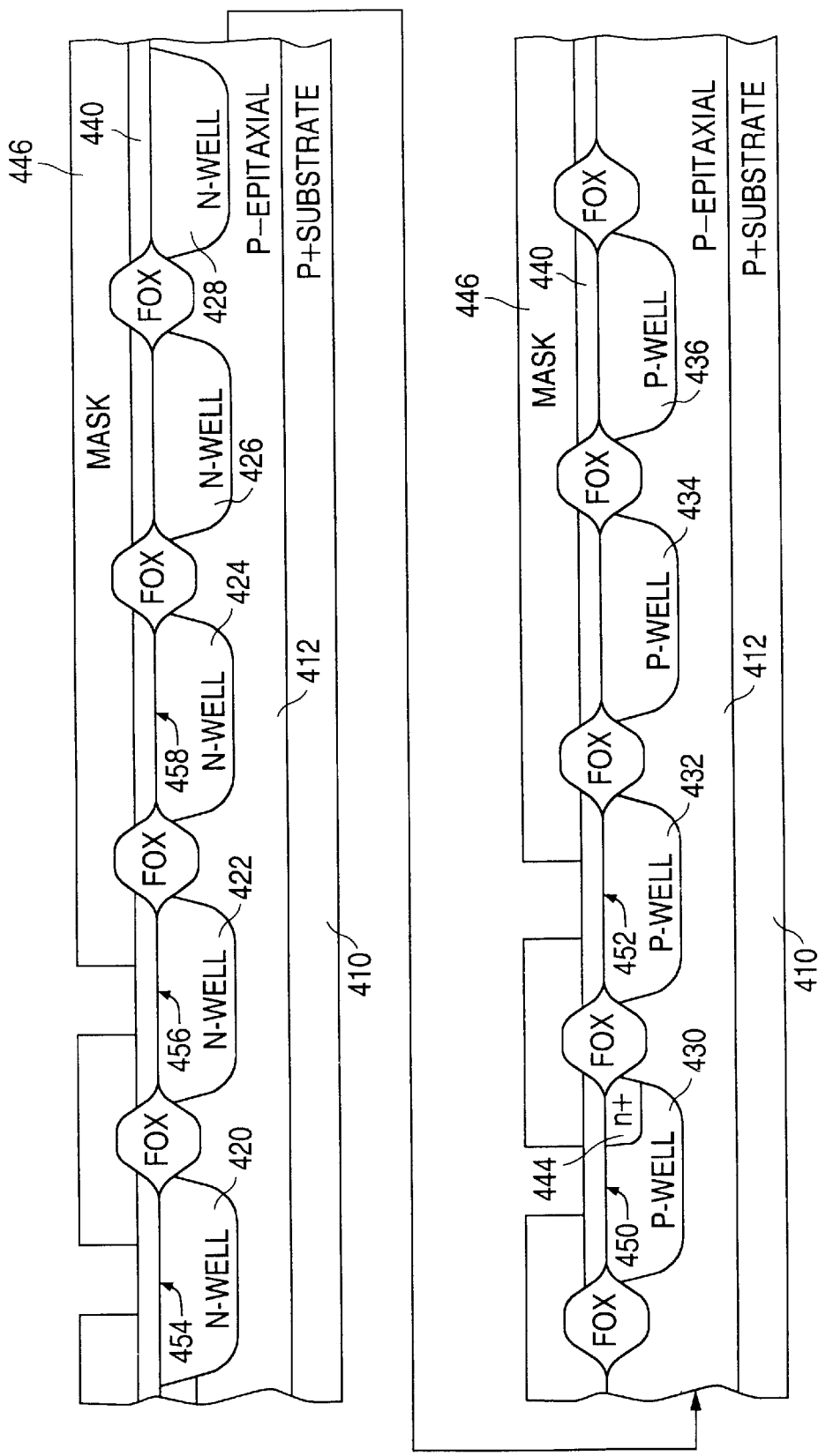

Next, as shown in FIG. 2B, an NMOS threshold voltage mask 446 is formed and patterned on oxide layer 440. In accordance with the present invention, threshold voltage mask 446 is patterned to expose a number of regions on the surface of oxide layer 440 that correspond with a number of to-be-formed memory channel regions 450 in p-well 430, a number of high-voltage NMOS channel regions 452 in p-well 432, a first depletion-mode channel region 454 in n-well 420, and a second depletion-mode channel region 456 in n-well 422.

Once threshold mask 446 has been patterned, the exposed regions of oxide layer 440 are implanted with a dopant, such as boron, to set the threshold voltages of the to-be-formed memory transistors and high-voltage NMOS transistors, and partially set the threshold voltage of the depletion-mode transistor in n-well 420, and the depletion-mode transistor in n-well 422. Boron 11, for example, can be implanted at a dose of $1.04 \times 10^{12}$ at an implant energy of 30 KeV. Threshold mask 446 is then removed.

Following this, a PMOS high-voltage threshold voltage mask (not shown) is formed and patterned on oxide layer 440. The PMOS threshold voltage mask is patterned to expose a number of regions on the surface of oxide layer 440 that correspond with a number of to-be-formed high voltage PMOS channel regions 458 in n-well 424. Once the PMOS threshold mask has been patterned, the exposed regions of oxide layer 440 are implanted with a dopant, such as boron, to set the threshold voltages of the to-be-formed high-voltage PMOS transistors. Boron 11, for example, can be implanted at a dose of $6.5 \times 10^{12}$ at an implant energy of 30 KeV. The PMOS threshold mask is then removed. After this, screen oxide layer 440 is removed.

Figure 2C:
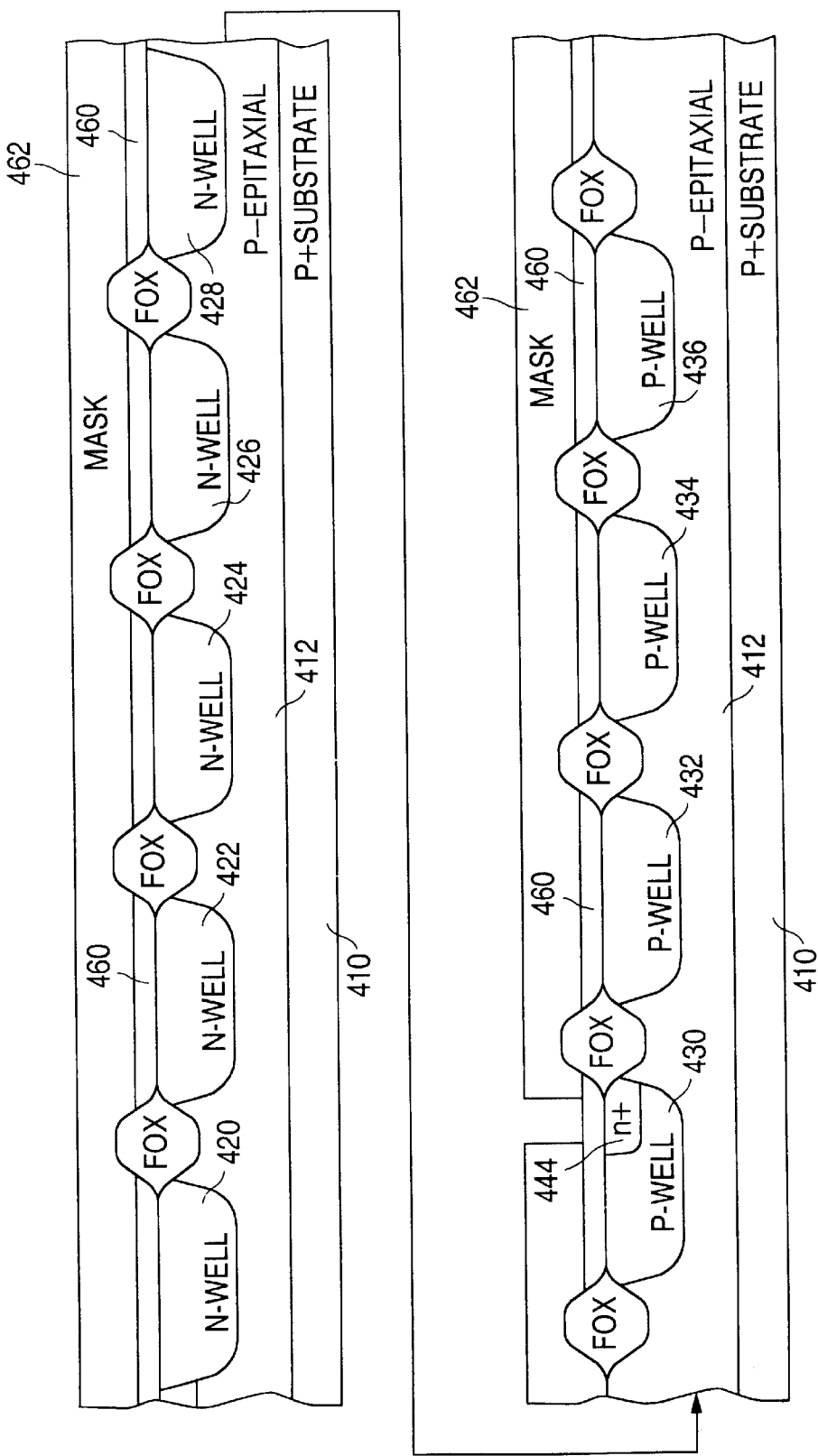

Next, as shown in FIG. 2C, a layer of gate oxide 460 is formed on epitaxial layer 412, followed by the formation and patterning of a tunneling mask 462 on oxide layer 460. Tunneling mask 462 is patterned to expose a number of regions on the surface of gate oxide layer 460 that overlie and correspond with the number of n+ buried regions 444. Once tunneling mask 462 has been patterned, the exposed regions of gate oxide layer 460 are etched until gate oxide layer 460 is removed from the surfaces of p-well 430 over n+ buried regions 444. Tunneling mask 462 is then stripped.

Figure 2D:
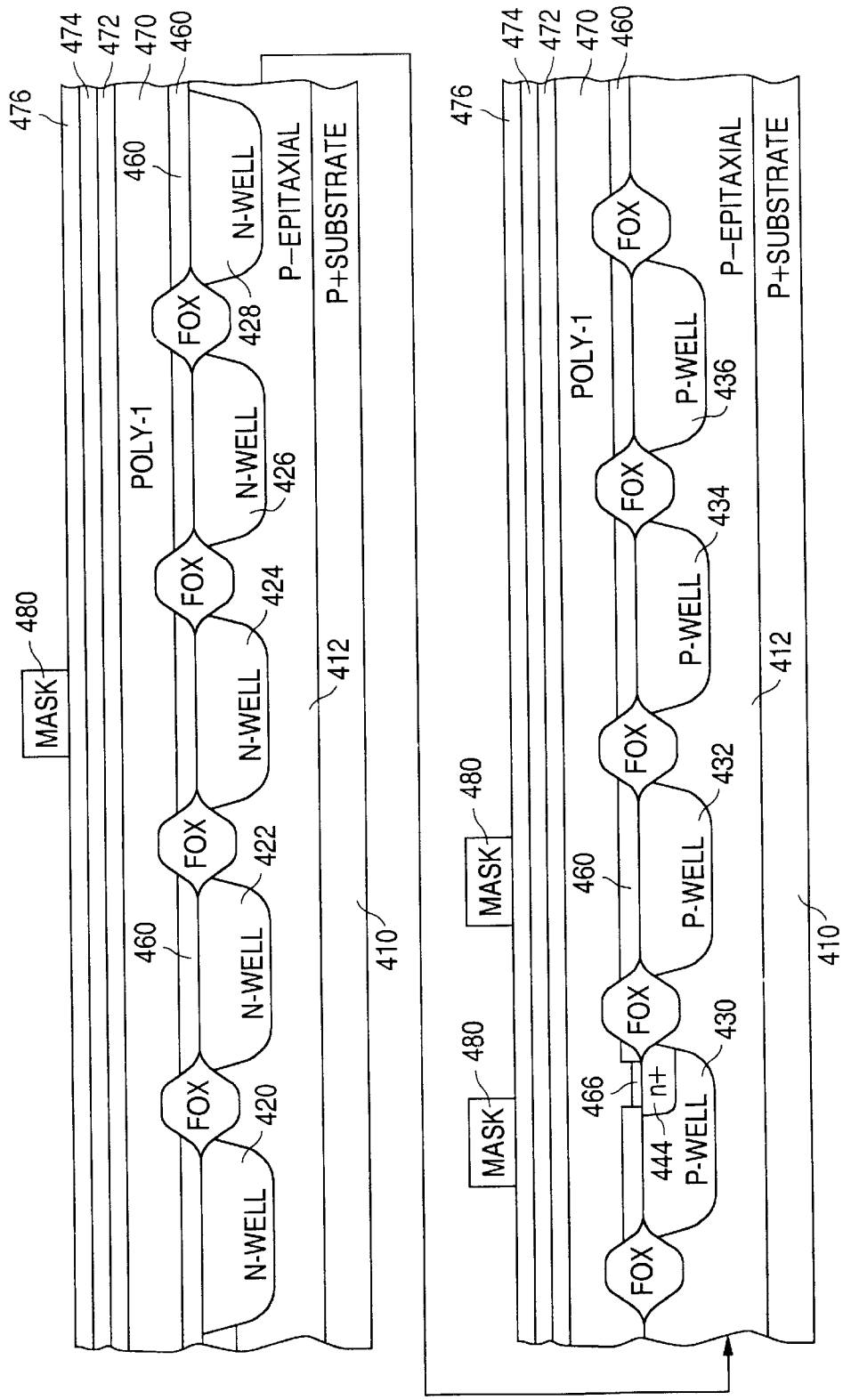

After this, as shown in FIG. 2D, a layer of tunnel oxide 466 is grown on the exposed surfaces of p-well 430. A first layer of polysilicon (poly-1) 470 is then formed on gate oxide layer 460 and tunnel oxide layer 466, and conventionally doped. Next, a layer of oxide 472 is formed on poly-1 layer 470, followed by the formation of an overlying layer of nitride 474, and an overlying layer of oxide 476. Oxide layer 472, nitride layer 474, and oxide layer 476 form an interpoly dielectric commonly known as ONO.

Once oxide layer 476 has been formed, a poly-1 mask 480 is formed and patterned on oxide layer 476. Poly-1 mask 480 is patterned to expose a number of regions on the surface of oxide layer 476 that correspond with a number of gates of the to-be-formed high-voltage transistors and a number of floating gates of the to-be-formed EEPROM transistors.

Figure 2E:
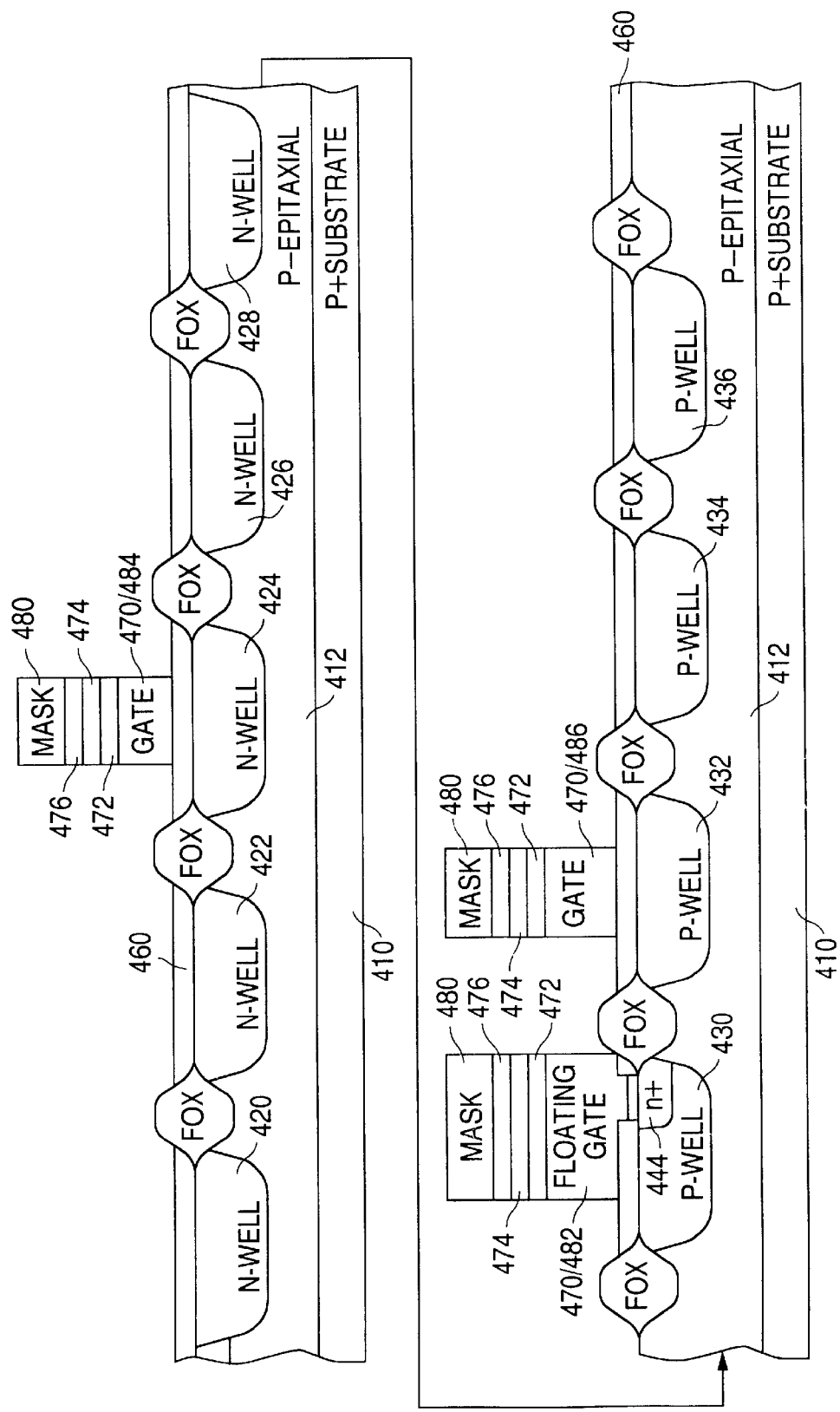

Next, as shown in FIG. 2E, the exposed regions of oxide layer 476 and the underlying layers of nitride layer 474, oxide layer 472, and poly-1 layer 470 are etched until poly-1 layer 470 is removed from the underlying layer of gate oxide 460. The etch forms the floating gates 482 of the EEPROM transistors, the gates 484 of the high-voltage PMOS transistors, and the gates 486 of the high-voltage NMOS transistors.

Following this, wafer 400 is blanket implanted with a dopant, such as boron, to set the threshold voltages of the low-voltage, low threshold voltage NMOS transistors in p-well 436, and the low-voltage, high threshold voltage PMOS transistors in n-well 426. The blanket implant also partially sets the threshold voltages of the low-voltage, low threshold voltage PMOS transistors in n-well 428, and the low-voltage, high threshold voltage NMOS transistors in p-well 434.

In accordance with the present invention, the blanket implant also partially sets the threshold voltages of the depletion-mode transistors in wells 420 and 422. Boron 11, for example, can be implanted at a dose of $2.9 \times 10^{12}$ at an implant energy of 22 KeV. (Mask 480 protects the underlying channel regions of the EEPROM transistors and the high-voltage transistors from the blanket implant.) Poly-1 mask 480 is then stripped.

Figure 2F:
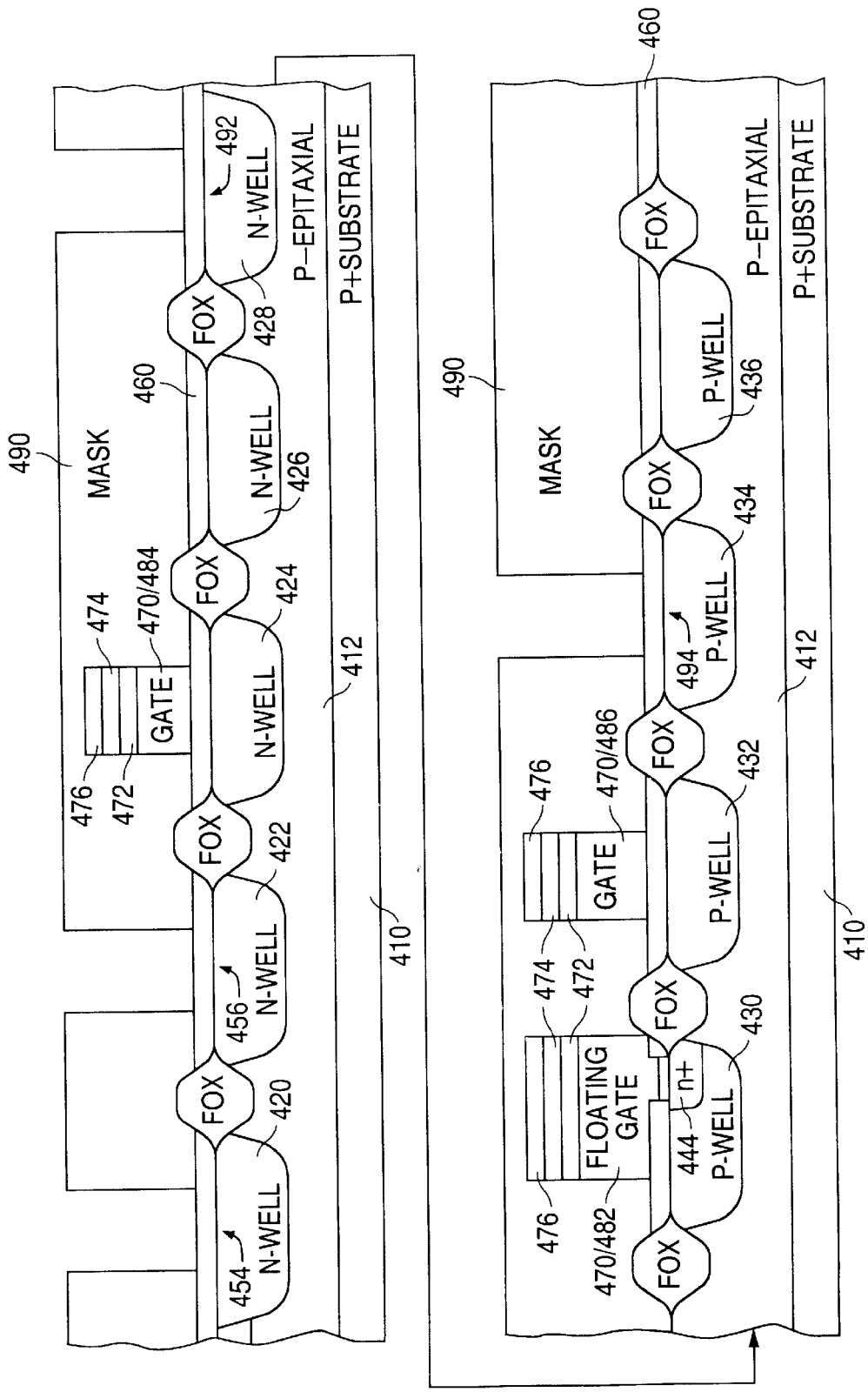

Next, as shown in FIG. 2F, an NMOS threshold voltage mask 490 is formed and patterned on oxide layers 460 and 476. In accordance with the present invention, threshold voltage mask 490 is patterned to expose a number of regions on the surface of oxide layer 460 that correspond with a number of to-be-formed low-voltage, low threshold voltage PMOS channel regions 492 in n-well 428, a number of low-voltage, high threshold voltage NMOS channel regions 494 in p-well 434, first depletion-mode channel region 454 in p-well 420, and second depletion-mode channel region 456 in p-well 422.

Once threshold mask 490 has been patterned, the exposed regions of oxide layer 460 are implanted with a dopant, such as boron, to set the threshold voltages of the to-be-formed low-voltage, low threshold voltage PMOS transistors in n-well 428 and the low-voltage, high threshold voltage NMOS transistors in p-well 434, and partially set the threshold voltage of the depletion-mode transistor in n-well 420, and the depletion-mode transistor is n-well 422. Boron 11, for example, can be implanted at a dose of $1.21 \times 10^{12}$ at an implant energy of 22 KeV. Threshold mask 490 is then removed.

Figure 2G:
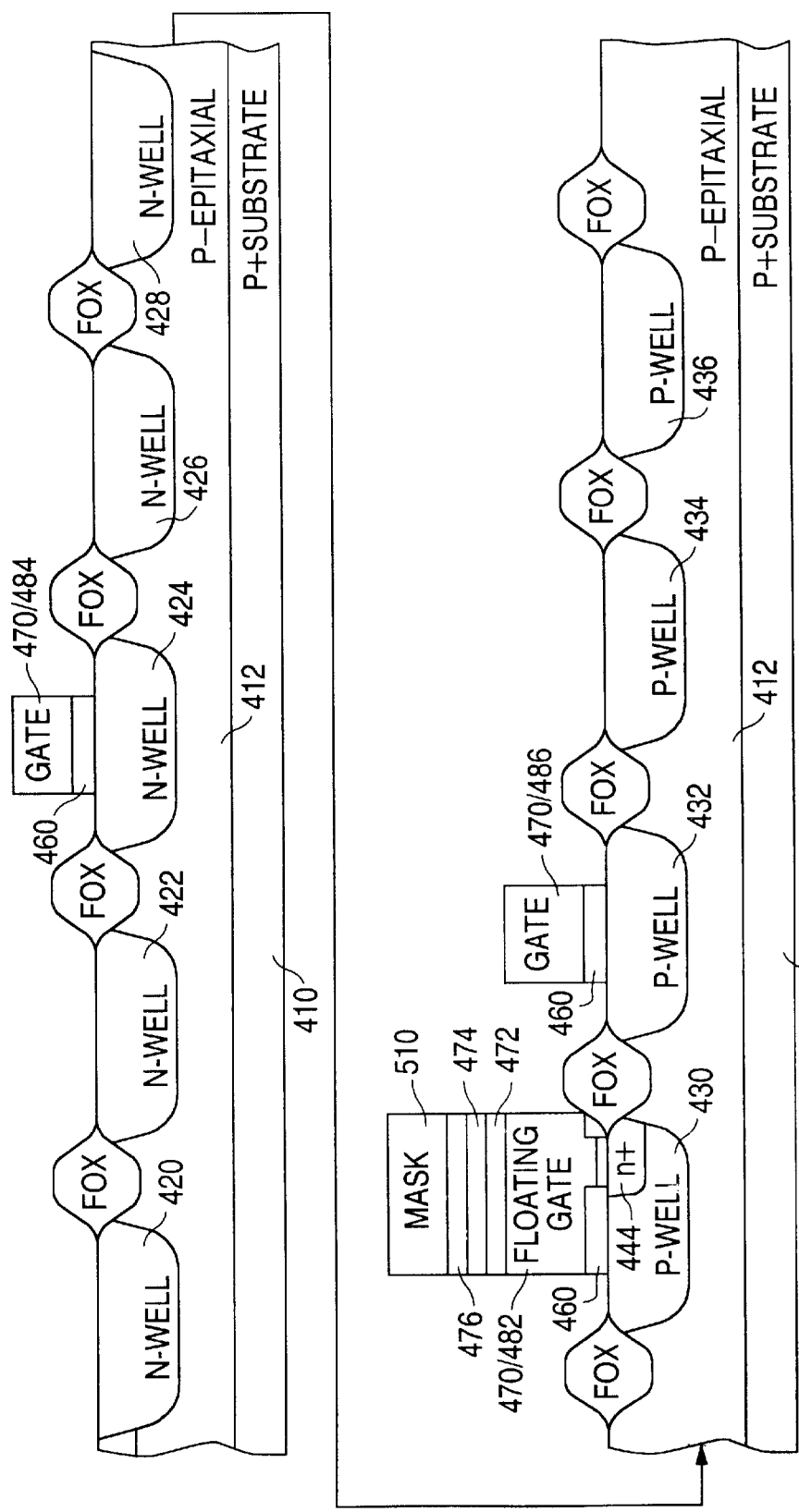

As shown in FIG. 2G, an ONO protect mask 510 is formed and patterned on gate oxide layers 460 and 476. ONO protect mask 510 is patterned to protect oxide layer 476 overlying the floating gates 482 of the to-be-formed EEPROM transistors in p-well 430. Following this, oxide layer 476, nitride layer 474, and oxide layer 472 are removed from the regions that overlie gates 484 and 486 of the to-be-formed high-voltage PMOS and NMOS transistors in n-well 424 and p-well 432, respectively. Next, gate oxide layer 460 is etched. The etch removes gate oxide 460 from the surface of n-wells 420, 422, 426, and 428, and p-wells 434 and 436. Mask 510 is then removed.

Figure 2H:
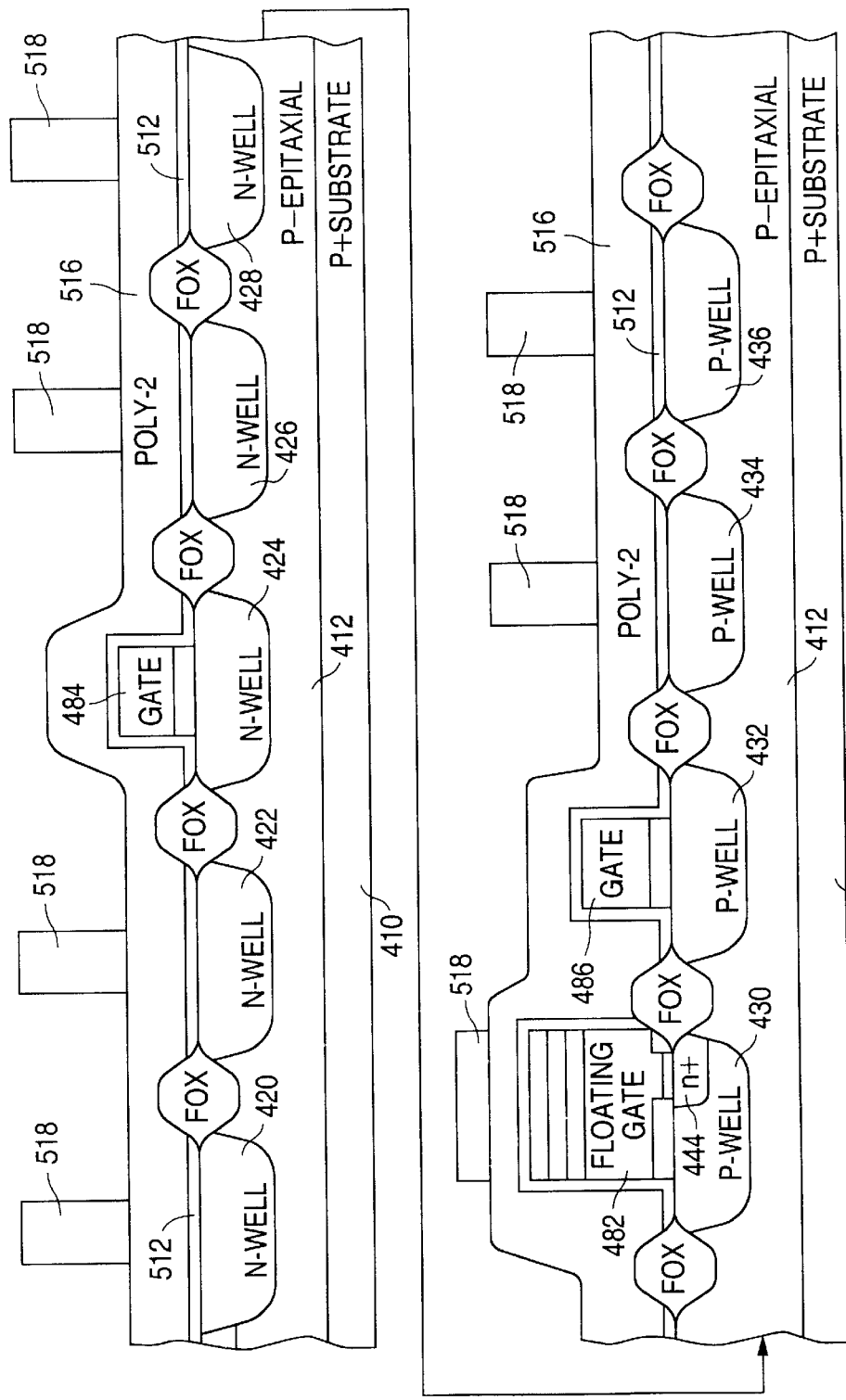
Figure 21:
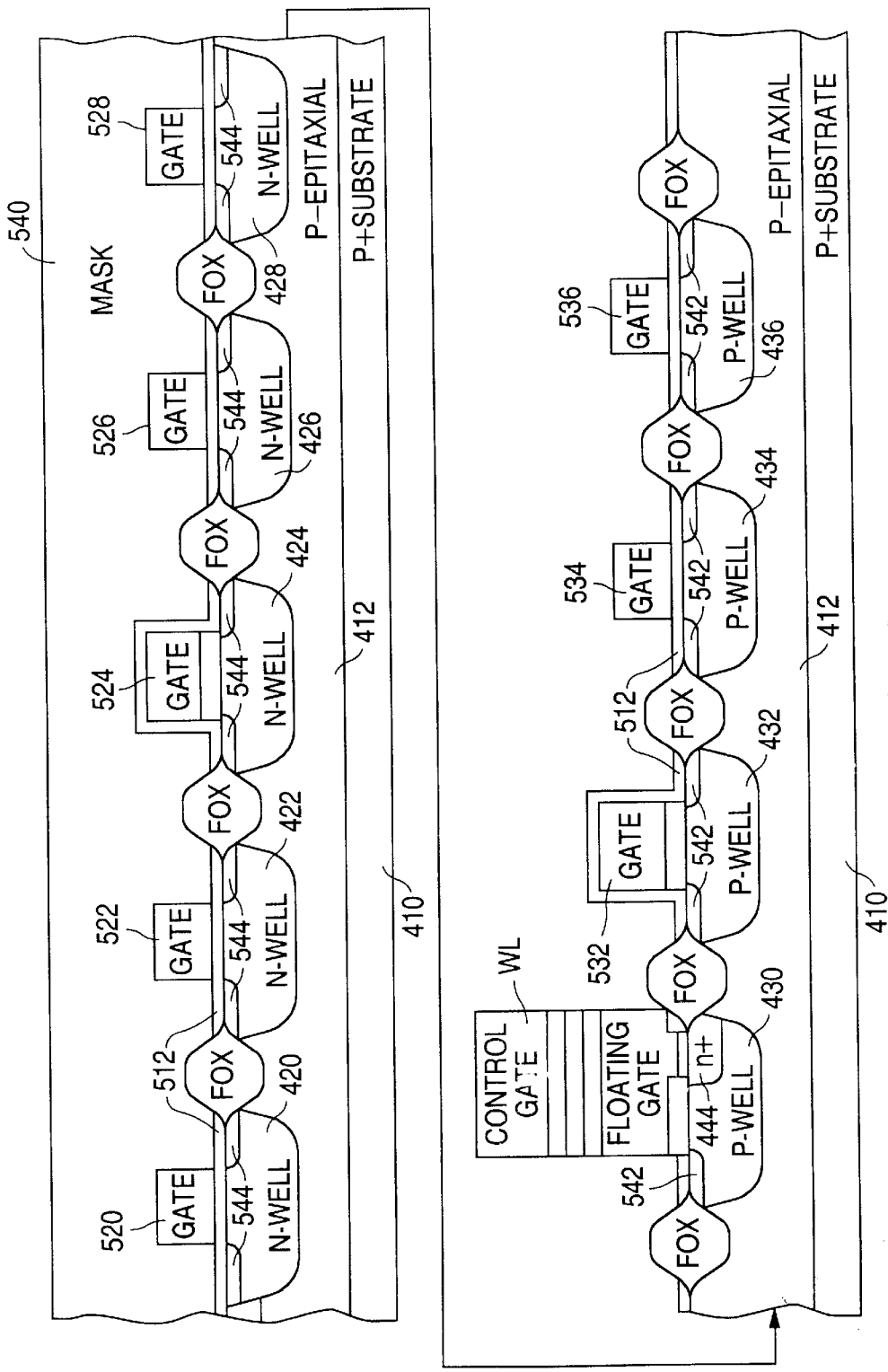

As shown in FIG. 2H, following the removal of mask 510, a thin layer of oxide 512 approximately 130 angstroms thick is formed on the exposed surfaces of wafer 400, including n-wells 420–428, p-wells 430–436, gates 484 and 486 over wells 424 and 432, and oxide layer 476 over well 430.

Following this, a second layer of polysilicon (poly-2) 516 is formed on oxide layer 512, and conventionally doped via, for example, ion implantation. Next, a word line/gate mask 518 is formed and patterned on poly-2 layer 516. Word line/gate mask 518 is patterned to define a number of strips on the surface of poly-2 layer 516 that correspond with a number of to-be-formed word lines (word lines include the control gates) over p-well 430.

In accordance with the present invention, word line/gate mask 518 is also patterned to define the gates of the to-be-formed low-voltage, low threshold voltage PMOS transistors; low-voltage, high threshold voltage PMOS transistors; low-voltage, low threshold voltage NMOS transistors; low-voltage, high threshold voltage NMOS transistors; first depletion-mode transistor; and second depletion-mode transistor.

Once word line/gate mask 518 has been patterned, the exposed regions of poly-2 layer 516 are etched until the exposed regions of poly-2 layer 516 are removed from the surface of oxide layer 512. Mask 518 is then removed. In accordance with the present invention, the first and second depletion-mode transistors in n-wells 420 and 422, respectively, are formed to have channel lengths that are approximately 0.3 to 0.8, and preferably 0.5, the length of the channel length of the low-voltage, low-threshold voltage PMOS transistor in well 428.

As shown in FIG. 2I, the etch of poly-2 layer 516 forms a number of word lines WL. The etch also forms the gates 520, 522, 526, and 528 of the to-be-formed depletion-mode transistor in well 120, depletion-mode transistor in well 422, low-voltage, high threshold voltage PMOS transistors in well 426, and low-voltage, low threshold voltage PMOS transistors in well 428, respectively. The etch additionally forms the gates 234, and 236 of the low-voltage, high threshold voltage NMOS transistors in well 434, and the low-voltage, low threshold voltage NMOS transistors in well 436.

The etch further exposes regions of oxide layer 512 that correspond with a number of to-be-formed source regions, a number of to-be-formed drain regions, and a number of to-be-formed source lines. Next, a NMOS low-density source/drain (NLDD) mask 540 is formed and patterned on wafer 100 to protect the PMOS regions of oxide layer 512. The exposed regions of oxide layer 512 are implanted with a dopant, such as phosphorous or arsenic, to form a number of n-type low-density source and drain regions 542 in wells 430–436 (only a LDD source region is formed in well 430). NLDD mask 540 is then stripped.

After this, a PMOS low-density source/drain (PLDD) mask (not shown) is formed and patterned on wafer 400 to protect the NMOS regions of oxide layer 512. The exposed regions of oxide layer 512 are implanted with a dopant, such as boron, to form a number of p-type low-density source and drain regions 544 in wells 420–428. The PLDD mask is then stripped.

Figure 2J:
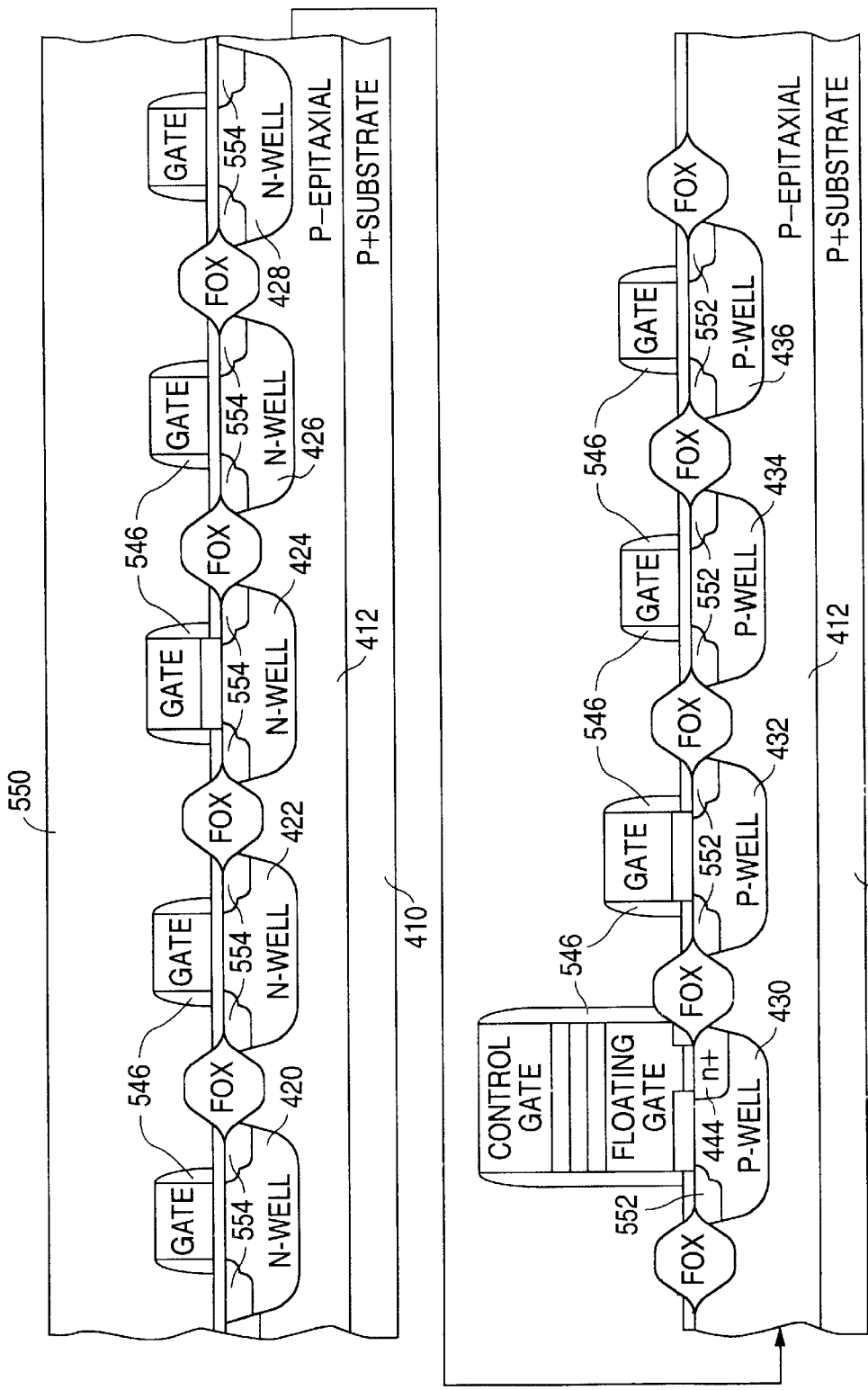

Next, as shown in FIG. 2J, a layer of spacer oxide is formed on wafer 400, and anisotropically etched away to form a number of side wall spacers 546. Once side wall spacers 546 have been formed, a NMOS source/drain mask 550 is formed and patterned on wafer 400 to protect the PMOS regions. The exposed regions of oxide layer 512 are implanted with a dopant, such as phosphorous or arsenic, to form a number of n+ source and drain regions 552 in wells 430–436. The implant also forms implanted source lines in well 430. NMOS drain mask 550 is then stripped.

After this, a PMOS source/drain mask (not shown) is formed and patterned on wafer 400 to protect the NMOS regions. The exposed regions of oxide layer 512 are implanted with a dopant, such as boron, to form a number of p+ source and drain regions 554 in wells 420–428. The p+ source and drain regions 554 have a nominal sheet rho of 140 ohms/square and a junction depth of 0.20 μm. The PMOS mask is then stripped. Following this, the method of the present invention continues with conventional steps.

Figure 2K:
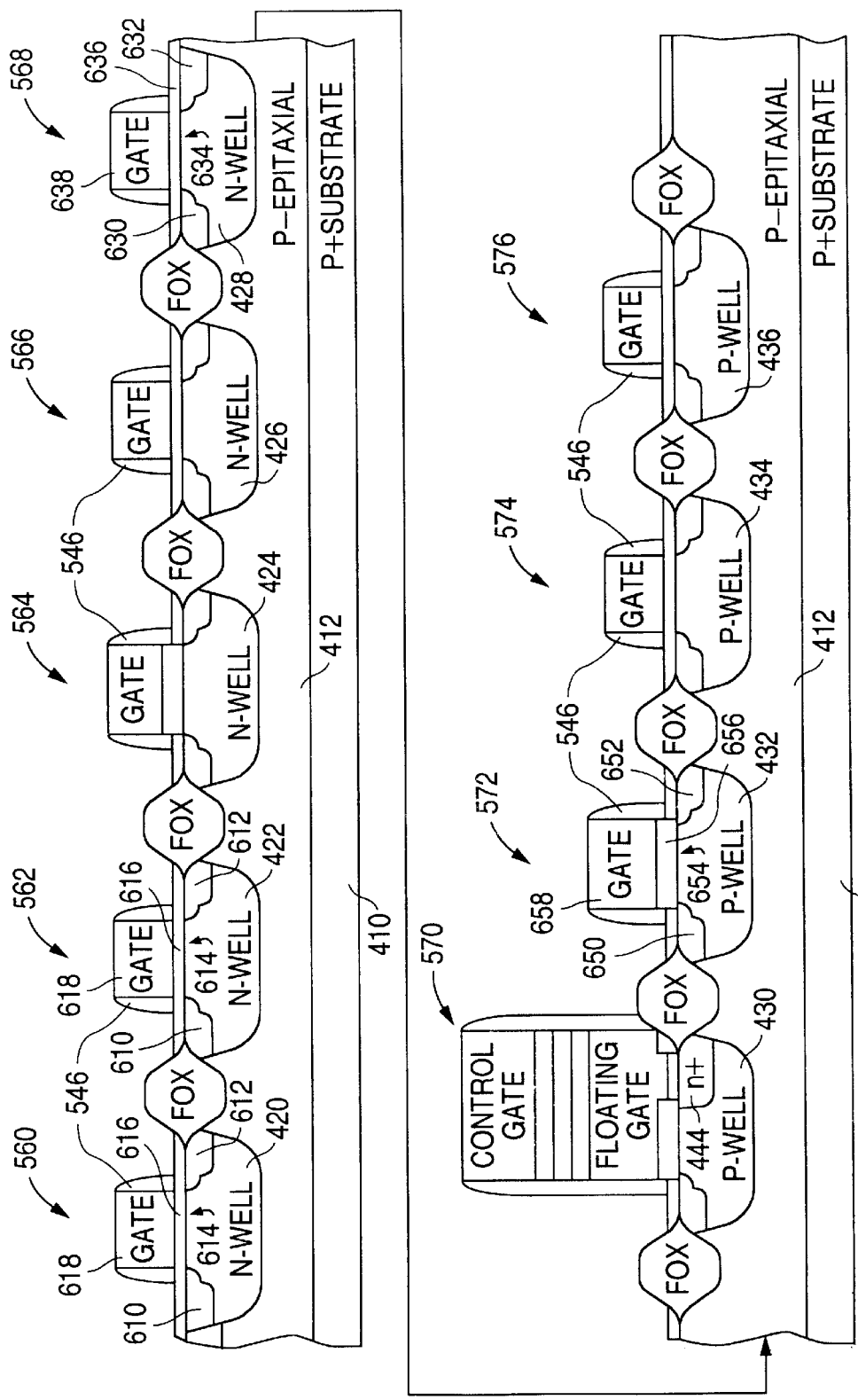

As shown in FIG. 2K, the implants form a first PMOS depletion-mode transistor 560 in n-well 420 and a second PMOS depletion-mode transistor 562 in n-well 422. Transistors 560 and 562 each have spaced-apart p+ source and drain regions 610 and 612, and a channel region 614 defined between source and drain regions 610 and 612. In addition, transistors 560 and 562 each have a layer of first gate oxide 616 that is formed over channel region 614, and a gate 618 that is formed over oxide layer 616. Channel region 614, in turn, has a first channel length and a first dopant concentration, while gate 618 has a first gate length.

The implants also form a PMOS high-voltage transistor 564 in n-well 424, a low-voltage, high threshold voltage PMOS transistor 566 in n-well 426, and a low-voltage, low threshold voltage PMOS transistor 568 in n-well 428. Transistor 568 has spaced-apart p+ source and drain regions 630 and 632, and a channel region 634 defined between source and drain regions 630 and 632.

In addition, transistor 568 has a layer of first gate oxide 636 that is formed over channel region 634, and a gate 638 that is formed over oxide layer 636. Channel region 634, in turn, has a second channel length and a second dopant concentration, while gate 638 has a second gate length.

In the present invention, the channel length of PMOS transistor 560 is approximately 0.3 to 0.8, preferably 0.5, the channel length of PMOS transistor 568. For example, the first gate length of transistor 560 can have an in-silicon length of approximately 0.72 μm while the second gate length of transistor 568 can have an in-silicon length of approximately 1.44 μm. In addition, the first gate length is approximately 0.3 to 0.8, preferably 0.5, the second gate length of PMOS transistor 568.

The implants also form an EEPROM memory cell 570 in p-well 430, a high-voltage NMOS transistor 572 in p-well 432, a low-voltage, high threshold voltage NMOS transistor 574 in p-well 434, and a low-voltage, low threshold voltage NMOS transistor 576 in p-well 436. Transistor 572 has spaced-apart n+ source and drain regions 650 and 652, and a channel region 654 defined between source and drain regions 650 and 652.

In addition, transistor 572 has a layer of first gate oxide 656 that is formed over channel region 654, and a gate 658 that is formed over oxide layer 656. Channel region 654, in turn, has a third channel length and a third dopant concentration, while gate 658 has a third gate length. The third channel length of transistor 572 is longer than the second channel length of transistor 568 and can be, for example, approximately 2.0 μm in silicon. In the present invention, channel region 614 has a dopant concentration substantially equal to approximately $5.15 \times 10^{12}$ which is equal to the dopant concentrations of channel regions 634 and 654 combined.

In accordance with the present invention, by forming PMOS transistors 560 and 562 to have channel lengths that are less than the low-voltage, low threshold voltage PMOS transistors 568, and by utilizing the threshold voltage implant of the high-voltage NMOS transistor along with the threshold voltage implants of the low-voltage, low threshold voltage PMOS transistors, PMOS transistor 560 and PMOS transistor 562 function as depletion-mode transistors. A depletion-mode transistor is a transistor that is substantially conductive (conducts more than a leakage current) when the gate, the source, and the bulk are connected to the same potential.

As a result, the method of the present invention provides depletion-mode transistors without requiring a mask and implant step dedicated to setting the threshold voltage of the depletion-mode transistors. Saving a mask and implant step, in turn, reduces the cost and complexity of forming the circuit.

In operation, depletion-mode transistor 560 is turned on by connecting, for example, well 420, source 610, and gate 618 to zero volts, and drain 612 to −5V. The structure and biasing of transistor 560 cause a current to flow due to drain induced barrier lowering. In addition, depletion-mode transistor 250 is turned off when, for example, well 420, source 610, and gate 618 are each connected to plus one volt, and drain 612 is connected to −5V. Depletion-mode transistor 562 operates in a similar fashion.

FIGS. 3–6 show aspects of the performance of depletion-mode transistor 560 in accordance with the present invention. The values of the drain-to-source current Ids shown in the figures were collected from devices 36.0 μm wide and have not been normalized. The drain-to-source current Ids values were transposed to absolute values of drain-to-source current Ids to allow plotting on a log axis where appropriate. The channel doping concentration for the depletion-mode transistors 560 in FIGS. 3–6 are equal.

Figure 3:
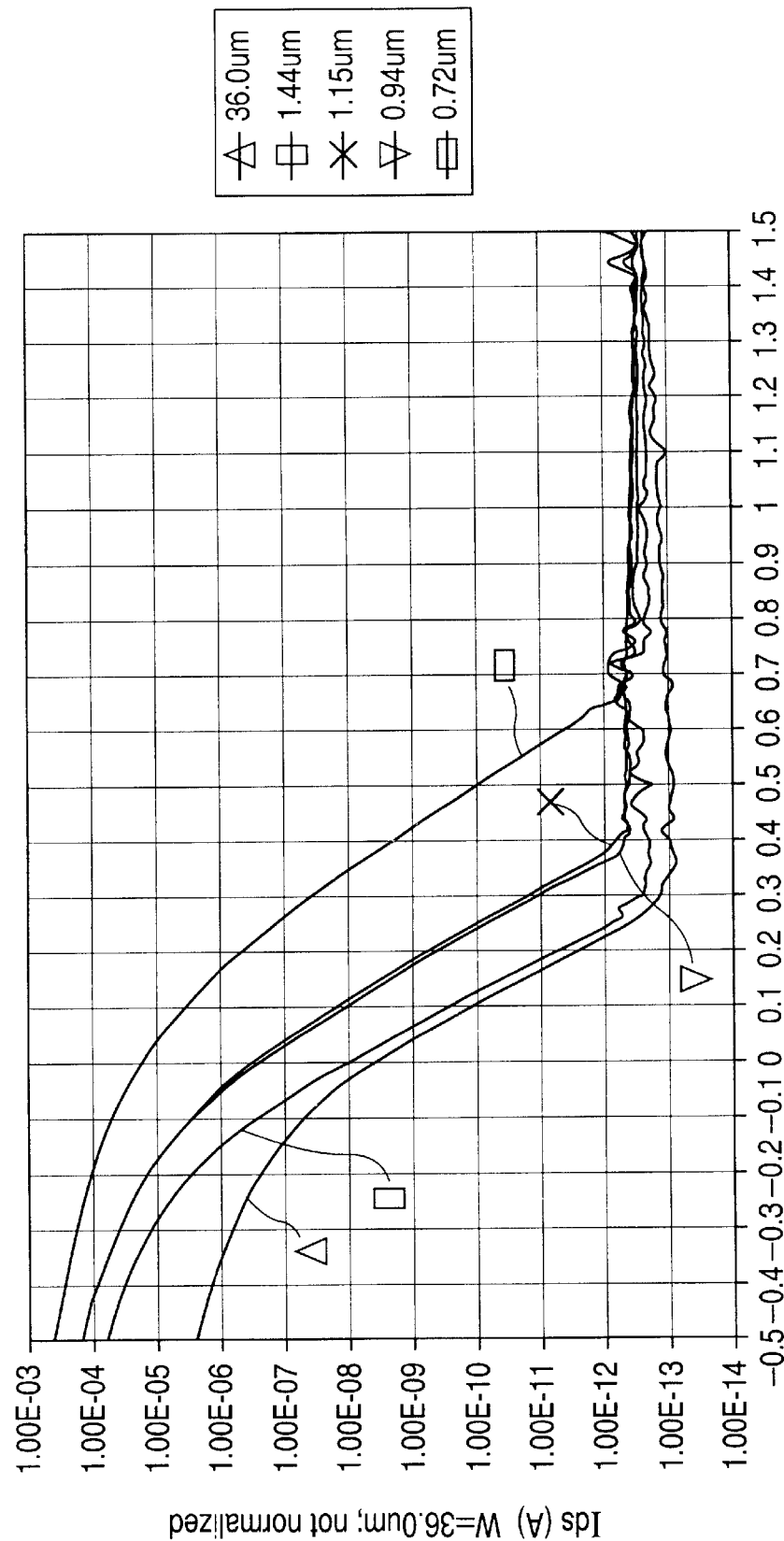
FIGS. 3–6 are graphs illustrating aspects of the performance of depletion-mode transistor 560 in accordance with the present invention.

FIG. 3 shows the current characteristics of the absolute value of the drain-to-source current Ids of five varying channel lengths of depletion-mode transistor 560 as Vgs and Vwell are varied from −0.5V to +1.5V. FIG. 3 shows that all devices exhibit varying degrees of the absolute value of the drain-to-source current Ids at a gate-to-source voltage Vgs that is equal to a well voltage Vwell that is equal to 0.0V (the on state).

In addition, FIG. 3 also shows that all channel lengths exhibit low levels of the absolute value of the drain-to-source current Ids current at a gate-to-source voltage Vgs that is equal to a well voltage Vwell that is equal to +1.0V (the off state). FIG. 3 further shows enhanced sub-threshold conduction characteristics as the channel length is reduced below 1.44 μm.

Figure 4:
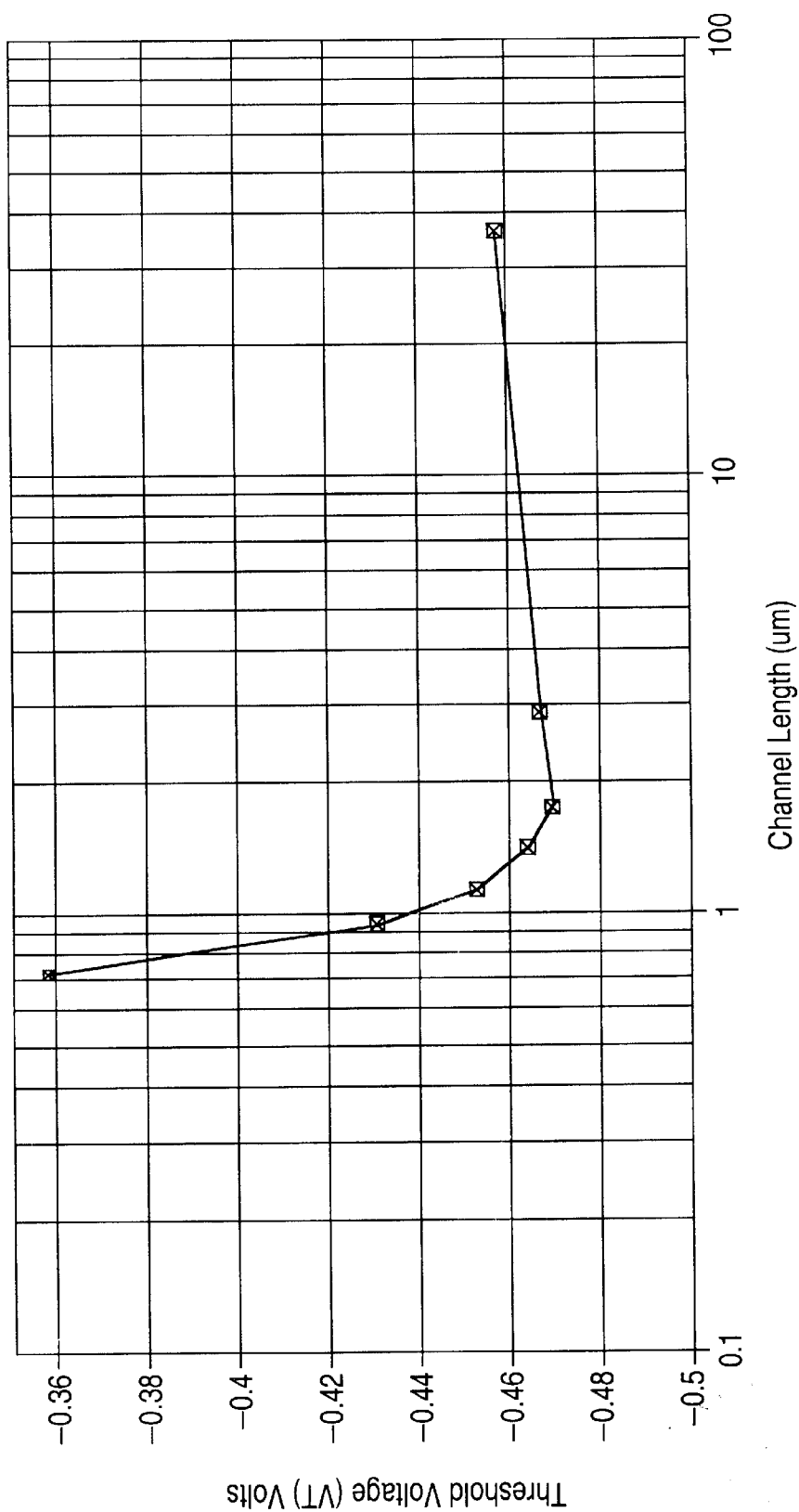

FIG. 4 shows the effect of the channel length on the effective threshold voltage. The variation in threshold voltage shown in FIG. 4 is due entirely to channel length effects. The channel lengths are, from left to right, 0.72 μm, 0.94 μm, 1.15 μm, 1.44 μm, 1.80 μm, and 2.88 μm. As shown in FIG.

4, the effective threshold voltage of the 0.72 µm device (−0.358V) is over 0.1V closer to 0.0V than the 1.44 µm device (−0.465V). Despite the reduction in the absolute value of the threshold voltage as channel lengths are reduced, the threshold voltage remains negative (enhancement-mode PMOS) even for the 0.72 µm device.

Figure 5:
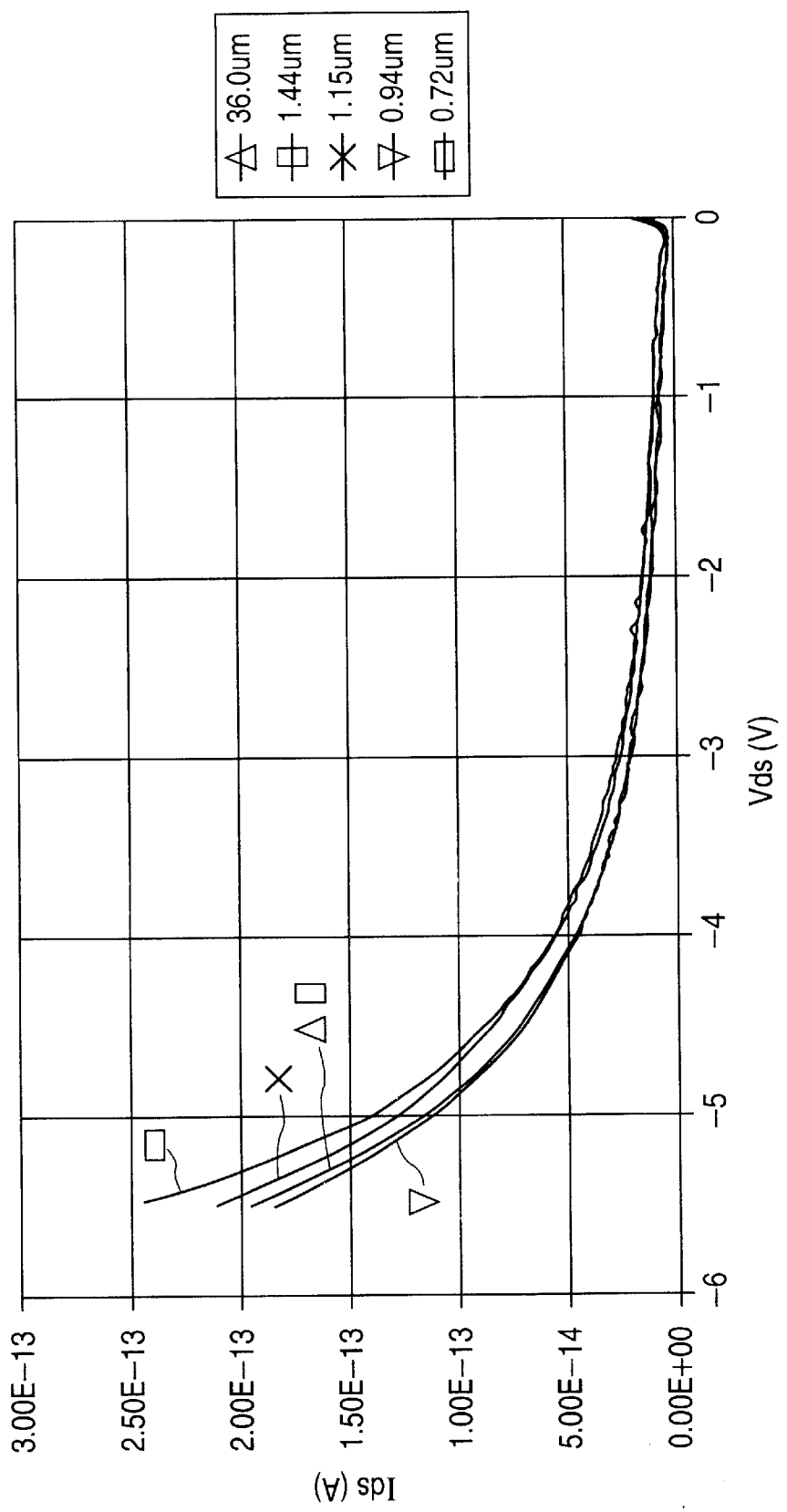

FIG. 5 shows the off state of the absolute value of the drain-to-source current Ids as a function of the drain-to-source voltage Vds and channel length. Under the defined off-state condition: the gate-to-source voltage Vgs equals the well voltage Vwell that equals +1.0V. In addition, the source voltage Vs equal zero volts and the drain-to-source voltage Vds equals −5.0V. Under these conditions, the absolute value of the drain-to-source current Ids remains within a range of 0.10 to 0.15 pA for all channel lengths. Further, the absolute value of the drain-to-source current Ids remains well under 1.0 pA over the entire drain-to-source voltage Vds range of 0.0V to −5.5V, under off-state bias conditions.

Figure 6:
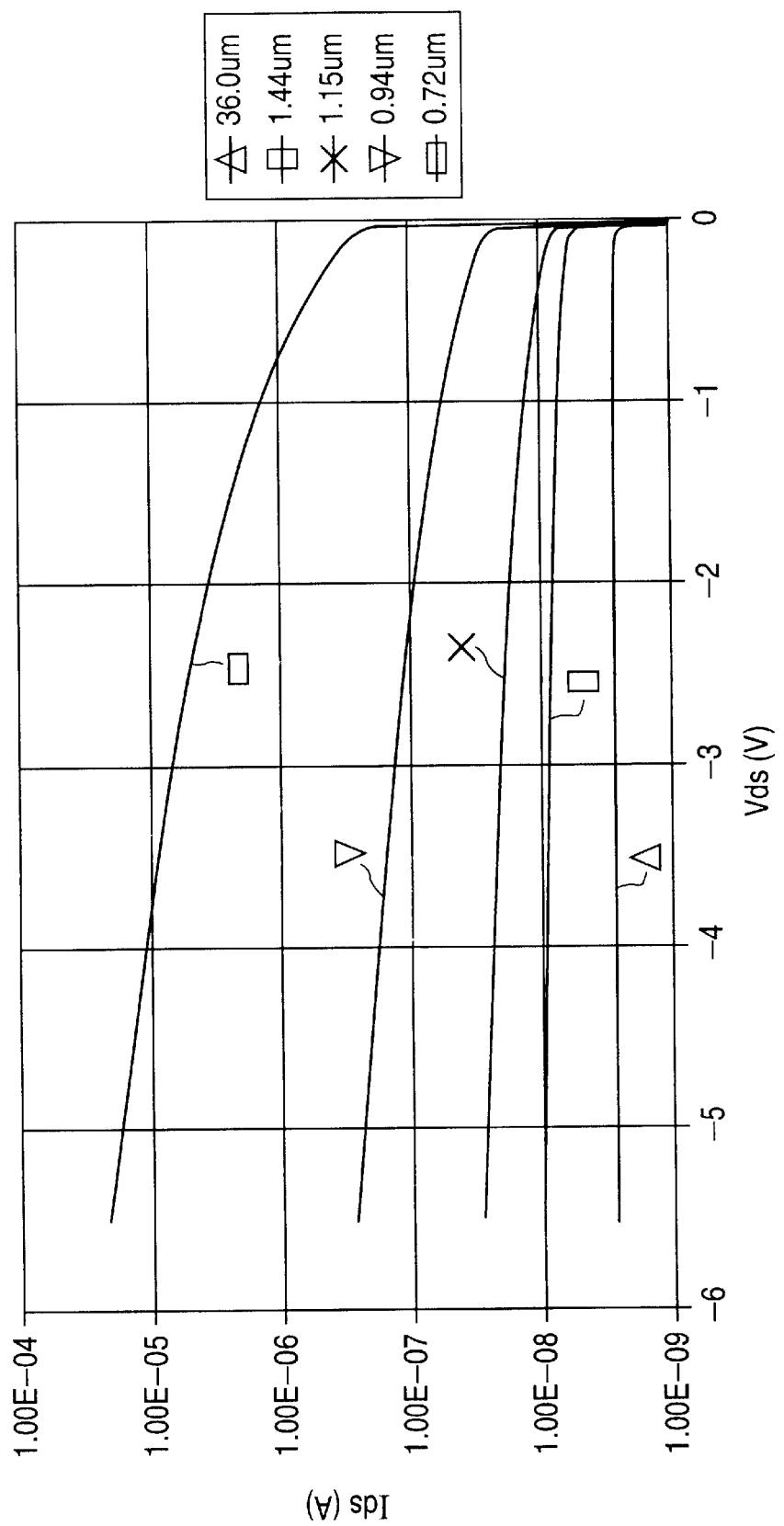

FIG. 6 is effectively the compliment of FIG. 5, showing on-state conditions of the absolute value of the drain-to-source current Ids as a function of the drain-to-source voltage Vds and the channel length. The defined on-state condition is: the gate-to-source voltage Vgs equals the source voltage Vs that equals the well voltage Vwell that equals 0.0V. In addition, the drain-to-source voltage Vds equals −5.0V. As shown in FIG. 6, it is under the on-state conditions where the effects of drain-induced-barrier lowering allows the short-channel enhancement-mode transistors to perform as a depletion-mode transistor. While the threshold voltage of the 0.72 µm transistor remains negative (see FIG. 4), significant amounts of the absolute value of the drain-to-source current Ids flows under sub-threshold conditions.

While the typical minimum channel length transistor (1.44 µm) exhibits an on-state to off-state current ratio of approximately $1.0 \times 10^5$, due to the effects of drain-induced-barrier-lowering, the 0.72 µm transistor exhibits an on-state to off-state current ratio of approximately $2.0 \times 10^8$.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A semiconductor circuit comprising:
   a first transistor having:
      a first semiconductor region;
      spaced-apart source and drain regions formed in the first semiconductor region;
      a first channel defined between the source and drain regions, the first channel having a first channel length and a first dopant concentration;
      a layer of first gate oxide formed over the first channel, the layer of first gate oxide having a thickness; and
      a gate formed over the layer of first gate oxide;
      the first transistor conducting more than a leakage current when the gate, the source, and the first semiconductor region are connected to a same potential;
   a second transistor having:
      a second semiconductor region;
      spaced-apart source and drain regions formed in the second semiconductor region;
      a second channel defined between the source and drain regions formed in the second semiconductor material, the second channel having a second channel length and a second dopant concentration;
      a layer of second gate oxide formed over the second channel, the layer of second gate oxide having a thickness, the thickness of the layer of first gate oxide being substantially equal to the thickness of the layer of second gate oxide; and
      a gate formed over the layer of second gate oxide;
   the second transistor being substantially non-conductive when the gate of the second transistor, the source of the second transistor, and the second semiconductor material are connected to a same potential, the first channel length being approximately 30 percent to 80 percent as long as the second channel length; and
   a third transistor having:
      a third semiconductor region;
      spaced-apart source and drain regions formed in the third semiconductor region;
      a third channel defined between the source and drain regions formed in the third semiconductor material, the third channel having a third channel length and a third dopant concentration;
      a layer of third gate oxide formed over the third channel, the layer of third gate oxide having a thickness,
   the third transistor being substantially non-conductive when the gate of the third transistor, the source of the third transistor, and the third semiconductor material are connected to a same potential, the thickness of the layer of third gate oxide being greater than the thickness of the layer of second gate oxide.

2. The circuit of claim 1 wherein the first dopant concentration is greater than the second dopant concentration.

3. The circuit of claim 1 wherein the first dopant concentration is substantially equal to a sum of the second dopant concentration and a dopant concentration implanted into the third channel.

4. The circuit of claim 3 wherein the second and third transistors have source and drain regions of the same conductivity type, and the first transistor has source and drain regions of an opposite conductivity type.

5. The circuit of claim 3 wherein the first and second transistors have source and drain regions of the same conductivity type, and the third transistor has source and drain regions of an opposite conductivity type.

6. The circuit of claim 1 and further comprising a well, only the first transistor being formed in the well.

* * * * *

UNITED STATES PATENT AND TRADEMARK OFFICE
CERTIFICATE OF CORRECTION

PATENT NO.    : 6,703,670 B1
DATED         : March 9, 2004
INVENTOR(S)   : Lines It is certified that error appears in the above-identified patent and that said Letters Patent is hereby corrected as shown below:

Column 1,
Line 51, delete "hight-voltage" and replace with -- high-voltage --.

Column 2,
Line 55, delete "poly-1" and replace with -- Poly-1 --.

Column 3,
Line 8, delete "poly-1" and replace with -- Poly-1 --.

Column 8,
Line 2, delete "gate".

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,703,670 B1  
APPLICATION NO. : 09/824653  
DATED : March 9, 2004  
INVENTOR(S) : Lines Page 1 of 1

It is certified that error appears in the above-identified patent and that said Letters Patent is hereby corrected as shown below:

On the cover of the application filed on July 7, 2000, the last word of the title of the invention is --CIRCUITS--

Response E in reply to the Office Action mailed June 19, 2003: Old Claim #21, After "isolation" and before "and" is the word --trenches;--

Signed and Sealed this

Nineteenth Day of August, 2008

JON W. DUDAS  
*Director of the United States Patent and Trademark Office*

UNITED STATES PATENT AND TRADEMARK OFFICE
CERTIFICATE OF CORRECTION

PATENT NO. : 6,703,670 B1  
APPLICATION NO. : 09/824653  
DATED : March 9, 2004  
INVENTOR(S) : Terry Lines Page 1 of 1

It is certified that error appears in the above-identified patent and that said Letters Patent is hereby corrected as shown below:

This certificate supersedes the Certificate of Correction issued August 19, 2008. The certificate should be vacated since no Certificate of Correction was granted for this patent number.

Signed and Sealed this

Fourteenth Day of October, 2008

JON W. DUDAS  
*Director of the United States Patent and Trademark Office*